United States Patent
Takahashi et al.

(10) Patent No.: US 11,257,846 B2
(45) Date of Patent: Feb. 22, 2022

(54) DISPLAY DEVICE AND ELECTRONIC DEVICE

(71) Applicant: Semiconductor Energy Laboratory Co., Ltd., Kanagawa-ken (JP)

(72) Inventors: Kei Takahashi, Kanagawa (JP); Hiroyuki Miyake, Aichi (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/909,244

(22) Filed: Jun. 23, 2020

(65) Prior Publication Data

US 2020/0357828 A1 Nov. 12, 2020

Related U.S. Application Data

(63) Continuation of application No. 16/525,846, filed on Jul. 30, 2019, now Pat. No. 10,700,098, which is a (Continued)

(30) Foreign Application Priority Data

Aug. 3, 2016 (JP) .............................. JP2016-152394

(51) Int. Cl.
*H01L 27/00* (2006.01)
*G09G 3/32* (2016.01)
(Continued)

(52) U.S. Cl.
CPC ....... *H01L 27/1225* (2013.01); *G09G 3/3225* (2013.01); *G09G 3/3233* (2013.01);
(Continued)

(58) Field of Classification Search
CPC ............. H01L 27/1225; H01L 27/1251; H01L 27/1222; H01L 27/1255; H01L 27/1262;
(Continued)

(56) References Cited

U.S. PATENT DOCUMENTS 4,466,081 A 8/1984 Masuoka
4,902,637 A 2/1990 Kondou et al.
(Continued)

FOREIGN PATENT DOCUMENTS

CN 001396156 2/2003
EP 2 511 896 A1 10/2012
(Continued)

OTHER PUBLICATIONS

Ishii, T. et al. "A Poly-Silicon TFT With a Sub-5-nm Thick Channel for Low-Power Gain Cell Memory in Mobile Applications," IEEE Transactions on Electron Devices, vol. 51, No. 11, pp. 1805-1810, dated in Nov. 2004.
(Continued)

*Primary Examiner* — Nikolay K Yushin

(74) *Attorney, Agent, or Firm* — Husch Blackwell LLP

(57) ABSTRACT

A display device including a display portion with an extremely high resolution is provided. The display device includes a pixel circuit and a light-emitting element. The pixel circuit includes a first element layer including a first transistor and a second element layer including a second transistor. A channel formation region of the first transistor includes silicon. The first transistor has a function of driving the light-emitting element. The second transistor functions as a switch. A channel formation region of the second transistor includes a metal oxide. The metal oxide functions as a semiconductor. The second element layer is provided over the first element layer.

34 Claims, 16 Drawing Sheets

Related U.S. Application Data continuation of application No. 15/664,703, filed on Jul. 31, 2017, now Pat. No. 10,373,983.

(51) Int. Cl.
| | |
|---|---|
| *H01L 27/12* | (2006.01) |
| *G09G 3/3225* | (2016.01) |
| *G09G 3/3233* | (2016.01) |
| *G09G 3/3266* | (2016.01) |
| *G09G 3/3275* | (2016.01) |
| *G11C 19/28* | (2006.01) |

(52) U.S. Cl.
CPC ....... *G09G 3/3266* (2013.01); *H01L 27/1222* (2013.01); *H01L 27/1251* (2013.01); *H01L 27/1255* (2013.01); *H01L 27/1262* (2013.01); *G09G 3/3275* (2013.01); *G09G 2300/0426* (2013.01); *G09G 2300/0465* (2013.01); *G09G 2310/0286* (2013.01); *G09G 2310/0291* (2013.01); *G09G 2310/08* (2013.01); *G09G 2330/023* (2013.01); *G09G 2354/00* (2013.01); *G11C 19/28* (2013.01)

(58) Field of Classification Search
CPC .. G09G 3/3233; G09G 3/3266; G09G 3/3225; G09G 3/3275; G09G 2300/0465; G09G 2300/0426; G09G 2300/9452; G09G 2300/0819; G09G 2300/0809; G09G 2310/08; G09G 2310/0286; G09G 2310/0291; G09G 2330/023; G09G 2330/021; G09G 2330/12; G09G 2354/00; G11C 19/28
See application file for complete search history.

(56) References Cited

U.S. PATENT DOCUMENTS

| | | |
|---|---|---|
| 5,349,366 A | 9/1994 | Yamazaki et al. |
| 5,648,277 A | 7/1997 | Zhang et al. |
| 5,770,483 A | 6/1998 | Kadosh et al. |
| 5,828,429 A | 10/1998 | Takemura |
| 6,023,308 A | 2/2000 | Takemura |
| 6,127,702 A | 10/2000 | Yamazaki et al. |
| 6,140,158 A | 10/2000 | Rhee et al. |
| 6,271,542 B1 | 8/2001 | Emma et al. |
| 6,579,727 B1 | 6/2003 | Zambrano |
| 6,620,659 B2 | 9/2003 | Emmma et al. |
| 6,693,301 B2 | 2/2004 | Takemura |
| 6,759,680 B1 | 7/2004 | Takemura |
| 6,787,835 B2 | 9/2004 | Atwood et al. |
| 6,876,045 B2 | 4/2005 | Takagi |
| 6,949,782 B2 | 9/2005 | Atwood et al. |
| 7,071,910 B1 | 7/2006 | Takemura |
| 7,116,302 B2 | 10/2006 | Takemura |
| 7,189,992 B2 | 3/2007 | Wager, III et al. |
| 7,225,986 B2 | 6/2007 | Mizutani et al. |
| 7,253,440 B1 | 8/2007 | Takemura |
| 7,306,981 B2 | 12/2007 | Kuwabara et al. |
| 7,339,187 B2 | 3/2008 | Wager, III et al. |
| 7,468,901 B2 | 12/2008 | Kameshiro et al. |
| 7,663,165 B2 | 2/2010 | Mouli |
| 7,674,650 B2 | 3/2010 | Akimoto et al. |
| 7,772,053 B2 | 8/2010 | Kameshiro et al. |
| 7,791,074 B2 | 9/2010 | Iwasaki |
| 7,833,851 B2 | 11/2010 | Kuwabara et al. |
| 7,859,889 B2 | 12/2010 | Kameshiro et al. |
| 7,888,207 B2 | 2/2011 | Wager, III et al. |
| 7,915,723 B2 | 3/2011 | Sasaki et al. |
| 7,935,582 B2 | 5/2011 | Iwasaki |
| 7,956,361 B2 | 6/2011 | Iwasaki |
| 7,956,947 B2 | 6/2011 | Lee et al. |
| 7,982,250 B2 | 7/2011 | Yamazaki et al. |
| 7,994,500 B2 | 8/2011 | Kim et al. |
| 8,044,464 B2 | 10/2011 | Yamazaki et al. |
| 8,049,253 B2 | 11/2011 | Isobe |
| 8,084,307 B2 | 12/2011 | Itagaki et al. |
| 8,134,152 B2 | 3/2012 | Choi et al. |
| 8,148,779 B2 | 4/2012 | Jeong et al. |
| 8,154,024 B2 | 4/2012 | Iwasaki |
| 8,188,480 B2 | 5/2012 | Itai |
| 8,203,143 B2 | 6/2012 | Imai |
| 8,207,756 B2 | 6/2012 | Shionoiri et al. |
| 8,212,248 B2 | 7/2012 | Itagaki et al. |
| 8,232,598 B2 | 7/2012 | Yamazaki et al. |
| 8,258,496 B2 | 9/2012 | Toda et al. |
| 8,288,197 B2 | 10/2012 | Yukawa et al. |
| 8,378,341 B2 | 2/2013 | Hayashi et al. |
| 8,378,403 B2 | 2/2013 | Kato |
| 8,384,076 B2 | 2/2013 | Park et al. |
| 8,410,838 B2 | 4/2013 | Kato et al. |
| 8,421,090 B2 | 4/2013 | Choi |
| 8,422,272 B2 | 4/2013 | Inoue et al. |
| 8,432,187 B2 | 4/2013 | Kato et al. |
| 8,450,142 B2 | 5/2013 | Hotta et al. |
| 8,450,783 B2 | 5/2013 | Yamazaki et al. |
| 8,455,868 B2 | 6/2013 | Yamazaki et al. |
| 8,455,876 B2 | 6/2013 | Choi et al. |
| 8,467,825 B2 | 6/2013 | Kato et al. |
| 8,487,303 B2 | 7/2013 | Takemura |
| 8,541,258 B2 | 9/2013 | Kim et al. |
| 8,541,846 B2 | 9/2013 | Saito |
| 8,563,973 B2 | 10/2013 | Inoue et al. |
| 8,563,977 B2 | 10/2013 | Shimada et al. |
| 8,581,257 B2 | 11/2013 | Murai et al. |
| 8,624,245 B2 | 1/2014 | Yamazaki |
| 8,659,016 B2 | 2/2014 | Kim et al. |
| 8,659,092 B2 | 2/2014 | Chen et al. |
| 8,685,803 B2 | 4/2014 | Chikama et al. |
| 8,737,109 B2 | 5/2014 | Yamazaki et al. |
| 8,742,412 B2 | 6/2014 | Goyal et al. |
| 8,809,850 B2 | 8/2014 | Yamazaki |
| 8,901,559 B2 | 12/2014 | Yamazaki |
| 9,007,812 B2 | 4/2015 | Koyama et al. |
| 9,035,313 B2 | 5/2015 | Jeong et al. |
| 9,047,814 B2 | 6/2015 | Toyomura et al. |
| 9,111,795 B2 | 8/2015 | Ieda et al. |
| 9,129,927 B2 | 9/2015 | Gupta et al. |
| 9,142,320 B2 | 9/2015 | Takemura |
| 9,190,413 B2 | 11/2015 | Kato et al. |
| 9,209,251 B2 | 12/2015 | Yamazaki |
| 9,214,508 B2 | 12/2015 | Cho et al. |
| 9,293,594 B2 | 3/2016 | Nishimura et al. |
| 9,324,449 B2 | 4/2016 | Yamazaki et al. |
| 9,336,709 B2 | 5/2016 | Lin et al. |
| 9,349,735 B2 | 5/2016 | Yamazaki et al. |
| 9,397,124 B2 | 7/2016 | Choi et al. |
| 9,401,432 B2 | 7/2016 | Kobayashi et al. |
| 9,412,291 B2 | 8/2016 | Toyotaka |
| 9,412,799 B2 | 8/2016 | Chang et al. |
| 9,443,984 B2 | 9/2016 | Yamazaki |
| 9,520,411 B2 | 12/2016 | Takahashi et al. |
| 9,530,854 B2 | 12/2016 | Choi |
| 9,543,370 B2 | 1/2017 | Tsai et al. |
| 9,564,478 B2 | 2/2017 | Chang et al. |
| 9,564,482 B2 | 2/2017 | Teraguchi et al. |
| 9,601,517 B2 | 3/2017 | Lin et al. |
| 9,685,469 B2 | 6/2017 | Kim et al. |
| 9,691,799 B2 | 6/2017 | Lee et al. |
| 9,734,756 B2 | 8/2017 | Gupta et al. |
| 9,768,208 B2 | 9/2017 | Choi |
| 9,773,810 B2 | 9/2017 | Ieda et al. |
| 9,786,697 B2 | 10/2017 | Lee et al. |
| 9,806,105 B2 | 10/2017 | Kim et al. |
| 9,818,344 B2 | 11/2017 | Lin et al. |
| 9,818,765 B2 | 11/2017 | Osawa et al. |
| 9,881,986 B2 | 1/2018 | Cho et al. |
| 9,985,055 B2 | 5/2018 | Makita et al. |
| 9,997,579 B2 | 6/2018 | Oh et al. |
| 10,002,564 B2 | 6/2018 | Kimura et al. |
| 10,002,968 B2 | 6/2018 | Yoneda |
| 10,020,354 B2 | 7/2018 | Kim et al. |
| 10,026,754 B2 | 7/2018 | Suzumura et al. |

(56) References Cited

U.S. PATENT DOCUMENTS

| | | |
|---|---|---|
| 10,032,799 B2 | 7/2018 | Ohara |
| 10,032,841 B2 | 7/2018 | Tsai et al. |
| 10,073,571 B2 | 9/2018 | Watanabe et al. |
| 10,074,675 B2 | 9/2018 | Shin et al. |
| 10,083,990 B2 | 9/2018 | Oh et al. |
| 10,090,332 B2 | 10/2018 | Hanyu et al. |
| 10,096,622 B2 | 10/2018 | Gupta et al. |
| 10,121,430 B2 | 11/2018 | Lin et al. |
| 10,121,899 B2 | 11/2018 | Moon et al. |
| 10,147,747 B2 | 12/2018 | Toriumi et al. |
| 10,163,383 B2 | 12/2018 | Lee |
| 10,177,170 B2 | 1/2019 | Miyamoto et al. |
| 10,236,330 B2 | 3/2019 | Maruyama |
| 10,312,312 B2 | 6/2019 | Kim et al. |
| 10,361,229 B2 | 7/2019 | Yamaguchi et al. |
| 10,373,983 B2 | 8/2019 | Takahashi et al. |
| 10,388,670 B2 | 8/2019 | Ieda et al. |
| 10,446,079 B2 | 10/2019 | Ka et al. |
| 10,476,020 B2 | 11/2019 | Kurata et al. |
| 10,546,526 B2 | 1/2020 | Morita et al. |
| 10,573,666 B2 | 2/2020 | Suzumura et al. |
| 10,707,237 B2 | 7/2020 | Gupta et al. |
| 10,741,588 B2 | 8/2020 | Gupta et al. |
| 10,826,008 B2 | 11/2020 | Kurata et al. |
| 10,910,404 B2 | 2/2021 | Ieda et al. |
| 11,049,882 B2 | 6/2021 | Suzumura et al. |
| 2001/0015450 A1 | 8/2001 | Sugibayashi et al. |
| 2003/0041275 A1 | 2/2003 | Nishio et al. |
| 2003/0218221 A1 | 11/2003 | Wager, III et al. |
| 2004/0184027 A1 | 9/2004 | Mizutani et al. |
| 2005/0237786 A1 | 10/2005 | Atwood et al. |
| 2005/0280000 A1 | 12/2005 | Ishii et al. |
| 2006/0113565 A1 | 6/2006 | Abe et al. |
| 2006/0216877 A1 | 9/2006 | Toyota et al. |
| 2008/0093595 A1 | 4/2008 | Song et al. |
| 2008/0108198 A1 | 5/2008 | Wager, III et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0027371 A1 | 1/2009 | Lin et al. |
| 2009/0045397 A1 | 2/2009 | Iwasaki |
| 2009/0114918 A1 | 5/2009 | Wang et al. |
| 2009/0134390 A1 | 5/2009 | Kodama et al. |
| 2009/0184315 A1 | 7/2009 | Lee et al. |
| 2010/0097838 A1 | 4/2010 | Tanaka et al. |
| 2010/0148171 A1 | 6/2010 | Hayashi et al. |
| 2010/0182223 A1 | 7/2010 | Choi et al. |
| 2010/0193785 A1 | 8/2010 | Kimura |
| 2010/0224870 A1 | 9/2010 | Iwasaki et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0101332 A1 | 5/2011 | Yamazaki et al. |
| 2011/0101333 A1 | 5/2011 | Shionoiri et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0108706 A1 | 5/2011 | Koyama |
| 2011/0108836 A1 | 5/2011 | Koyama et al. |
| 2011/0110145 A1 | 5/2011 | Yamazaki et al. |
| 2011/0116310 A1 | 5/2011 | Yamazaki et al. |
| 2011/0121285 A1 | 5/2011 | Yamazaki et al. |
| 2011/0121286 A1 | 5/2011 | Yamazaki et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156117 A1 | 6/2011 | Yamazaki et al. |
| 2011/0194331 A1 | 8/2011 | Kawae et al. |
| 2011/0215328 A1 | 9/2011 | Morosawa et al. |
| 2012/0032171 A1 | 2/2012 | Saito et al. |
| 2012/0132911 A1 | 5/2012 | Shimada et al. |
| 2012/0273773 A1 | 11/2012 | Ieda et al. |
| 2013/0021228 A1 | 1/2013 | Miwa et al. |
| 2014/0011329 A1 | 1/2014 | Zhang et al. |
| 2014/0112379 A1 | 4/2014 | Biyani et al. |
| 2015/0055051 A1 | 2/2015 | Osawa et al. |
| 2015/0069358 A1 | 3/2015 | Chida et al. |
| 2015/0123084 A1 | 5/2015 | Kim et al. |
| 2015/0214256 A1 | 7/2015 | Miyairi |
| 2015/0243203 A1 | 8/2015 | Kim et al. |
| 2015/0317020 A1 | 11/2015 | Watanabe et al. |
| 2016/0086979 A1 | 3/2016 | Yamazaki |
| 2016/0163745 A1 | 6/2016 | Choi et al. |
| 2016/0260718 A1 | 9/2016 | Yamazaki et al. |
| 2017/0256569 A1 | 9/2017 | Ohara |
| 2017/0278869 A1 | 9/2017 | Hiramatsu et al. |
| 2018/0174891 A1 | 6/2018 | Shionoiri et al. |
| 2018/0348959 A1 | 12/2018 | Lin et al. |
| 2019/0006394 A1 | 1/2019 | Gupta et al. |
| 2020/0075636 A1 | 3/2020 | Gupta et al. |

FOREIGN PATENT DOCUMENTS

| | | |
|---|---|---|
| EP | 2 518 767 A2 | 10/2012 |
| JP | 05-029571 | 2/1993 |
| JP | 05-107561 A | 4/1993 |
| JP | 05-299653 A | 11/1993 |
| JP | 10-003091 | 1/1998 |
| JP | 2784615 B2 | 8/1998 |
| JP | 2001-053164 | 2/2001 |
| JP | 2002-093924 | 3/2002 |
| JP | 2002-368226 | 12/2002 |
| JP | 2006-261178 | 9/2006 |
| JP | 2007-096055 | 4/2007 |
| JP | 2007-220820 | 8/2007 |
| JP | 2007-250863 | 9/2007 |
| JP | 2008-277665 | 11/2008 |
| JP | 2009-117669 | 5/2009 |
| JP | 2010-003910 A | 1/2010 |
| JP | 2011-048339 A | 3/2011 |
| JP | 2013-008946 A | 1/2013 |
| JP | 2013-051421 A | 3/2013 |
| JP | 2015-156486 A | 8/2015 |
| JP | 2015-194577 A | 11/2015 |
| JP | 2015-225104 A | 12/2015 |
| JP | 2016-046527 A | 4/2016 |
| JP | 2016-091027 A | 5/2016 |
| JP | 6324507 B2 | 5/2018 |
| JP | 6683690 B2 | 4/2020 |
| KR | 2008-0052107 | 6/2008 |
| KR | 2015-0101413 A | 9/2015 |
| KR | 2016-0043327 A | 4/2016 |
| TW | 201128611 | 8/2011 |
| TW | 201303830 | 1/2013 |
| TW | 201601285 | 1/2016 |
| WO | WO 2011/052386 A1 | 5/2011 |
| WO | WO 2011/068773 A1 | 6/2011 |
| WO | WO 2014/063116 A2 | 4/2014 |
| WO | WO 2015/031037 A1 | 3/2015 |
| WO | WO 2016/048385 A1 | 3/2016 |

OTHER PUBLICATIONS

Kim, W. et al. "An Experimental High-Density DRAM Cell with a Built-in Gain Stage," IEEE Journal of Solid-State Circuits, vol. 29, No. 8, pp. 978-981, dated in Aug. 1994.

Shukuri, S. et al. "A Semi-Static Complementary Gain Cell Technology for Sub-1 V Supply DRAM's," IEEE Transactions on Electron Devices, vol. 41, No. 6, pp. 926-931, dated in Jun. 1994.

Shukuri, S. et al. "A Complementary Gain Cell Technology for sub-1 V Supply DRAMs," IEDM 92: Technical Digest of International Electron Devices Meeting, pp. 1006-1008, dated Dec. 13, 1992.

Taiwanese Office Action (Application No. 106124615) dated Mar. 24, 2021.

DISPLAY DEVICE AND ELECTRONIC DEVICE

This application is a continuation of copending U.S. application Ser. No. 16/525,846, filed on Jul. 30, 2019 which is a continuation of U.S. application Ser. No. 15/664,703, filed on Jul. 31, 2017 (now U.S. Pat. No. 10,373,983 issued Aug. 6, 2019) which are all incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention particularly relates to a semiconductor device, a light-emitting device, a display device, an electronic device, a lighting device, a driving method thereof, or a manufacturing method thereof. In particular, one embodiment of the present invention relates to a display device (display panel). Another embodiment of the present invention relates to an electronic device, a light-emitting device, or a lighting device which includes a display device, or a manufacturing method thereof.

In this specification and the like, a semiconductor device generally means a device that can function by utilizing semiconductor characteristics. A transistor, a semiconductor circuit, an arithmetic device, a memory device, and the like are each one embodiment of the semiconductor device. A light-emitting device, a display device, an electronic device, a lighting device, and an electronic device may each include a semiconductor device.

2. Description of the Related Art

A display device mounted on a head-mounted display or the like is required to have an extremely high resolution. For example, Patent Document 1 discloses an electroluminescent (EL) display device in which a transistor included in a pixel is formed on a silicon on insulator (SOI) substrate in order to increase the resolution of a display portion.

REFERENCE

Patent Document

[Patent Document 1] PCT International Publication No. 2014/63116

SUMMARY OF THE INVENTION

The leakage current in an off state (off-state current) of the transistor formed on the SOI substrate is several picoamperes (pico: $1 \times 10^{-12}$); therefore, when the transistor is used for a pixel, it is difficult to reduce the frame frequency.

Considering the signal/noise (S/N) ratio or variation in electrical characteristics of the transistor, several volts of signal voltage (video voltage) needs to be supplied from a source line to the pixel. Therefore, the transistor to which the video voltage is applied is required to have a high withstand voltage. To obtain a transistor with a high withstand voltage, the channel length (L) of the transistor needs to be increased to approximately 1 µm, which has greatly restricted the circuit layout.

In the case where the resolution of the display portion is increased, a current flowing into a display element decreases with a decrease in area of the display element in one pixel. However, the transistor formed on the SOI substrate has such high field-effect mobility that its current supply capability is excessively high, leading to difficulty in driving the display element with a proper amount of current. As an effective countermeasure against this problem, the channel length (L) of the transistor may be increased to approximately 1 µm, which, however, has greatly restricted the circuit layout as described above.

An object of one embodiment of the present invention is to provide a display device in which the resolution of a display portion can be increased. Another object is to provide a display device whose bezel can be narrowed. Another object is to provide a display device which can have an uncomplicated circuit design. Another object is to provide a low-power display device. Another object is to provide a novel display device. Another object is to provide an electronic device including the display device (display panel). Another object is to provide a novel electronic device.

Note that the description of these objects does not preclude the existence of other objects. One embodiment of the present invention does not need to achieve all the objects. Other objects will be apparent from and can be derived from the description of the specification and the like.

One embodiment of the present invention is a display device including a pixel circuit and a light-emitting element. The pixel circuit includes a first element layer including a first transistor and a second element layer including a second transistor. A channel formation region of the first transistor includes silicon. The first transistor has a function of driving the light-emitting element. The second transistor functions as a switch. A channel formation region of the second transistor includes a metal oxide. The metal oxide functions as a semiconductor. The second element layer is provided over the first element layer.

One embodiment of the present invention is a display device including a pixel circuit and a light-emitting element. The pixel circuit includes a first element layer including a first transistor and a second element layer including a second transistor. A channel formation region of the first transistor includes silicon. The first transistor has a function of driving the light-emitting element. The second transistor functions as a switch. A channel formation region of the second transistor includes a metal oxide. The metal oxide functions as a semiconductor. The second element layer is provided over the first element layer. A layer including the light-emitting element is provided over the second element layer.

One embodiment of the present invention is a display device including a pixel circuit, a light-emitting element, and a driver circuit. The pixel circuit includes a first element layer including a first transistor and a second element layer including a second transistor. The driver circuit includes a third transistor and a fourth transistor. The driver circuit is electrically connected to a source line or a gate line. A channel formation region of the first transistor includes silicon. The first transistor has a function of driving the light-emitting element. The second transistor functions as a switch. A channel formation region of the second transistor includes a metal oxide. The metal oxide functions as a semiconductor. The third transistor and the fourth transistor are provided in the first element layer. The second element layer is provided over the first element layer.

One embodiment of the present invention is a display device including a pixel circuit, a light-emitting element, and a driver circuit. The pixel circuit includes a first element layer including a first transistor and a second element layer including a second transistor. The driver circuit includes a third transistor and a fourth transistor. The driver circuit is electrically connected to a source line or a gate line. A channel formation region of the first transistor includes silicon. The first transistor has a function of driving the light-emitting element. The second transistor functions as a switch. A channel formation region of the second transistor includes a metal oxide. The metal oxide functions as a semiconductor. The third transistor and the fourth transistor are provided in the first element layer. The second element layer is provided over the first element layer. A layer including the light-emitting element is provided over the second element layer.

The display device of one embodiment of the present invention preferably has the following configuration: the pixel circuit further includes a fifth transistor; the fifth transistor functions as a switch; and the fifth transistor is provided in the second element layer.

In this specification, a display device may include any of the following modules: a module in which a connector such as a flexible printed circuit (FPC) or a tape carrier package (TCP) is attached to a display element; a module having a TCP provided with a printed wiring board at the end thereof; and a module having an integrated circuit (IC) directly mounted by a chip on glass (COG) method over a substrate over which a display element is formed.

According to one embodiment of the present invention, a display device in which the resolution of a display portion can be increased can be provided. A display device whose bezel can be narrowed can be provided. A display device which can have an uncomplicated circuit design can be provided. A low-power display device can be provided. A novel display device can be provided. An electronic device including the display device (display panel) can be provided. A novel electronic device can be provided.

Note that the description of these effects does not preclude the existence of other effects. One embodiment of the present invention does not necessarily have all the effects. Other effects will be apparent from and can be derived from the description of the specification, the drawings, the claims, and the like.

DETAILED DESCRIPTION OF THE INVENTION

Figure 1A:
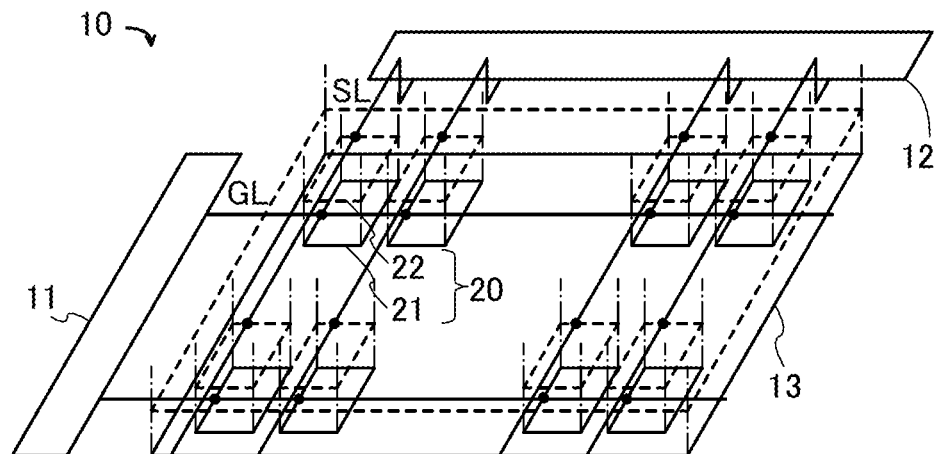
FIGS. 1A and 1B are schematic diagrams illustrating one embodiment of the present invention.

Embodiments will be described in detail with reference to the drawings. Note that the present invention is not limited to the following description, and it will be readily appreciated by those skilled in the art that modes and details can be modified in various ways without departing from the spirit and the scope of the present invention. Therefore, the present invention should not be interpreted as being limited to the description of the embodiments below.

In the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

In each drawing described in this specification, the size, the layer thickness, or the region of each component is exaggeratedly illustrated for clarity in some cases. Therefore, embodiments of the present invention are not limited to such a scale.

In this specification and the like, ordinal numbers such as "first" and "second" are used to avoid confusion among components and do not limit the components numerically.

Embodiment 1

In a display device of one embodiment of the present invention, a transistor for driving a light-emitting element (driver transistor) is provided in a first element layer, and a transistor functioning as a switch (selection transistor) for supplying a video voltage of a source line to a gate of the driver transistor is provided in a second element layer over the first element layer. The driver transistor includes silicon in a channel formation region, like a transistor formed using a silicon on insulator (SOI) substrate. A channel formation region of the selection transistor includes a metal oxide functioning as a semiconductor (hereinafter also referred to as an oxide semiconductor or an OS).

By arranging the driver transistor and the selection transistor in different layers, the layout area of the driver transistor can be increased. With the channel formation region including an oxide semiconductor, the selection transistor can have a higher withstand voltage than a transistor including silicon in a channel formation region. By arranging the selection transistor and the driver transistor in different element layers, restrictions on the circuit layout can be eased, so that the driver transistor can be designed to have a large channel length. This enables not only a circuit layout with a driver transistor having adjusted current supply capability but also an increase in withstand voltage of the driver transistor. Moreover, when an impurity element is added to the channel formation region, for example, the driver transistor can have less variation in electrical characteristics such as threshold voltage.

FIG. 1A is a schematic diagram illustrating a configuration of a display device.

A display device 10 illustrated in FIG. 1A includes a driver circuit 11, a driver circuit 12, and a display portion 13.

The driver circuit 11 functions as a gate line driver circuit. The driver circuit 11 outputs a scan signal to a gate line GL.

The driver circuit 12 functions as a source line driver circuit. The driver circuit 12 outputs a video voltage to each source line SL.

The display portion 13 includes a plurality of pixel circuits 20. The pixel circuit 20 has a function of driving a light-emitting element (not illustrated), i.e. a display element, in accordance with signals such as a scan signal and a video voltage.

The pixel circuit 20 includes an element layer 21 and an element layer 22. For example, the pixel circuit 20 includes two transistors: a selection transistor and a driver transistor.

As illustrated in FIG. 1A, the element layer 21 and the element layer 22 are stacked. Note that the illustration of the display element provided over the element layer 22 of the pixel circuit 20 is omitted in FIG. 1A.

In the element layer 21, a transistor including silicon in a channel formation region (Si transistor) is provided as the driver transistor.

The Si transistor is preferably formed using single-crystal silicon such as a silicon on insulator (SOI) substrate or a separation by implanted oxygen (SIMOX) substrate. Alternatively, a Si transistor in which an impurity region and an element isolation region are directly formed in a single-crystal silicon wafer may also be used.

Note that the term "SOI substrate" in this specification refers not only to a substrate in which a silicon semiconductor layer is provided over an insulating surface but also to a substrate in which a semiconductor layer including a material other than silicon is provided over an insulating surface. That is, the semiconductor layer included in the "SOI substrate" is not limited to a silicon semiconductor layer. A substrate in the "SOT substrate" is not limited to a semiconductor substrate such as a silicon wafer and may be a non-semiconductor substrate such as a glass substrate, a quartz substrate, a sapphire substrate, or a metal substrate. That is, the term "SOT substrate" also includes a conductive substrate having an insulating surface and an insulating substrate over which a layer including a semiconductor material is provided.

The threshold voltage of a Si transistor can be easily controlled by channel doping. A Si transistor including single-crystal silicon in a channel formation region can have high field-effect mobility. Therefore, when the Si transistor in the element layer 21 is used as the driver transistor, variation in threshold voltage can be reduced and the amount of current flowing therethrough can be increased.

The driver transistor, i.e. the Si transistor in the element layer 21, and the selection transistor in the element layer 22 are vertically stacked in separate layers; thus, the layout area of the driver transistor can be increased. In this case, even when the area of one pixel is small, the Si transistor functioning as the driver transistor can surely have a large area. For example, in a display device with a pixel density of 3000 ppi, the area of one pixel, which corresponds to the area of one of striped subpixels, can be estimated to be approximately 2.75 μm×8.75 μm. In the case where the selection transistor and the driver transistor each have a channel length of 1 μm, this area imposes strict restrictions on the circuit layout including two transistors; in contrast, this area is large enough for one Si transistor having a channel length of 1 μm. Therefore, the channel length of the Si transistor can be increased, whereby the withstand voltage can be increased and excessive current supply capability can be adjusted. Note that ppi is a unit indicating the number of pixels per inch.

A Si transistor can be microfabricated. When formed using a Si transistor, a logic circuit or the like which needs to operate at high speed can be stacked over the same substrate as the pixel circuit. Accordingly, the weight of the display device 10 can be reduced, leading to a reduction in weight of an electronic device including the display device 10.

Although the driver transistor used for the element layer 21 is preferably a p-channel transistor, an n-channel may also be used. The transistor in the element layer 21 is a transistor including silicon in a channel formation region; as such a transistor, either a p-channel transistor or an n-channel transistor can be formed just by changing the conductivity type of an impurity element added.

As the light-emitting element whose light emission is controlled by the pixel circuit 20, for example, an organic EL element, an inorganic EL element, or a light-emitting diode (LED) element can be used.

In the element layer 22, a transistor including an oxide semiconductor in a channel formation region (OS transistor) is provided as the selection transistor.

An oxide semiconductor which can be used for the element layer 22 is resistant to avalanche breakdown and has a high withstand voltage. For example, in the case of silicon, which has a small band gap of 1.12 eV, avalanche-like generation of electrons, called avalanche breakdown, is likely to occur; this phenomenon increases the number of electrons which are so accelerated that they can go over a barrier to a gate insulating layer. In contrast, since the oxide semiconductor has a wide band gap of 2 eV or more, avalanche breakdown is less likely to occur and its resistance to hot-carrier degradation is higher than that of silicon; this is why the oxide semiconductor has a high withstand voltage.

The band gap of silicon carbide, which is one of materials having high withstand voltages, is substantially equal to the band gap of the oxide semiconductor used for an oxide semiconductor layer; however, the field-effect mobility of the oxide semiconductor is lower than that of silicon carbide by approximately two orders of magnitude. Thus, in the oxide semiconductor, electrons are less likely to be accelerated, and a barrier to a gate insulating layer is higher than that in silicon carbide, gallium nitride, or silicon; therefore, the number of electrons injected into the gate insulating layer is extremely small. Accordingly, the oxide semiconductor is less likely to cause hot-carrier degradation and has a higher withstand voltage than silicon carbide, gallium nitride, or silicon.

Therefore, even a miniaturized OS transistor has a low off-state current. Furthermore, an OS transistor has a higher withstand voltage than a Si transistor. A miniaturized OS transistor can operate even at a low frame frequency. Furthermore, a miniaturized OS transistor can be resistant to dielectric breakdown due to application of a video voltage.

Figure 1B:
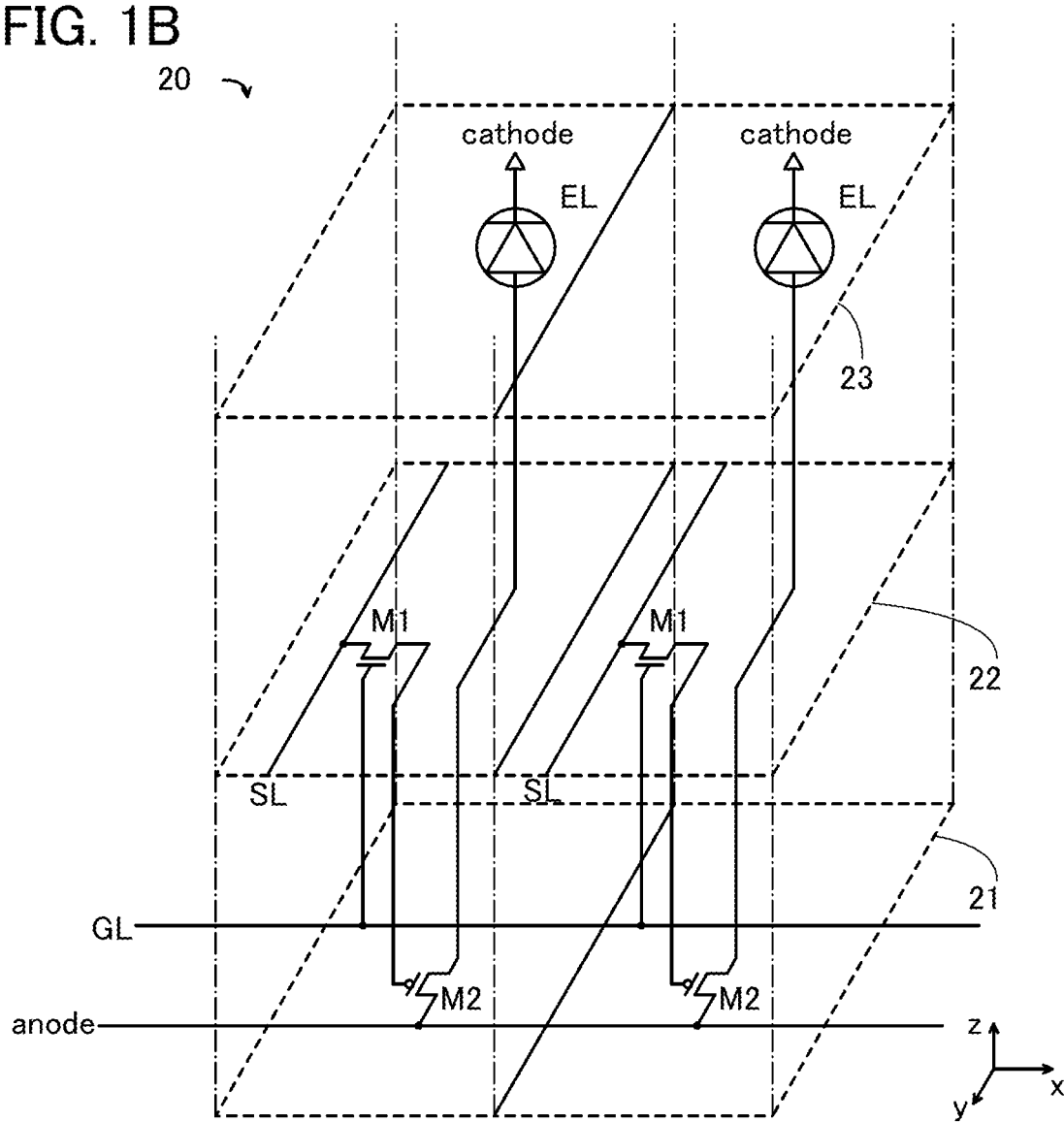

FIG. 1B is a schematic circuit diagram in which the element layer 21 and the element layer 22 included in the pixel circuit 20 in FIG. 1A and the light-emitting element connected to the pixel circuit 20 are illustrated in separate layers. Note that FIG. 1B illustrates pixel circuits and light-emitting elements of two pixels.

Note that FIG. 1B shows an x direction, a y direction, and a z direction. As illustrated in FIG. 1B, the x direction is parallel to the gate line GL; the y direction is parallel to the source line SL; and the z direction is perpendicular to a plane defined by the x direction and the y direction. As the element layer 21 and the element layer 22, layers including transistors are stacked in the z direction.

In FIG. 1B, the element layer 21 includes the gate line GL, an anode line "anode", and a transistor M2 which is a driver transistor. In FIG. 1B, the element layer 22 includes the source line SL and a transistor M1 which functions as a selection transistor. In FIG. 1B, an element layer 23 includes a light-emitting element EL and a cathode line "cathode".

As illustrated in FIG. 1B, elements such as transistors in the respective layers can be electrically connected to each other through a wiring or the like.

As illustrated in FIGS. 1A and 1B, in the display device 10 of one embodiment of the present invention, the transistor M2 for driving the light-emitting element EL is provided in the element layer 21, and the transistor M1 functioning as a switch for supplying a video voltage of the source line SL to a gate of the transistor M2 is provided in the element layer 22 over the element layer 21. The transistor M2 includes silicon in a channel formation region, like a transistor formed using an SOI substrate. A channel formation region of the transistor M1 includes an oxide semiconductor.

By arranging the transistor M1 and the transistor M2 included in the pixel circuit 20 in different layers, the layout area of the transistor M2 can be increased. With the channel formation region including an oxide semiconductor, the transistor M1 can have a higher withstand voltage than a transistor including silicon in a channel formation region. By arranging the transistor M1 and the transistor M2 in different element layers, restrictions on the circuit layout can be eased, so that the transistor M2 can be designed to have a large channel length. This enables not only a circuit layout with the transistor M2 having adjusted current supply capability but also an increase in withstand voltage of the transistor M2. Moreover, when an impurity element is added to the channel formation region, for example, the transistor M2 can have less variation in electrical characteristics such as threshold voltage.

Figure 2:
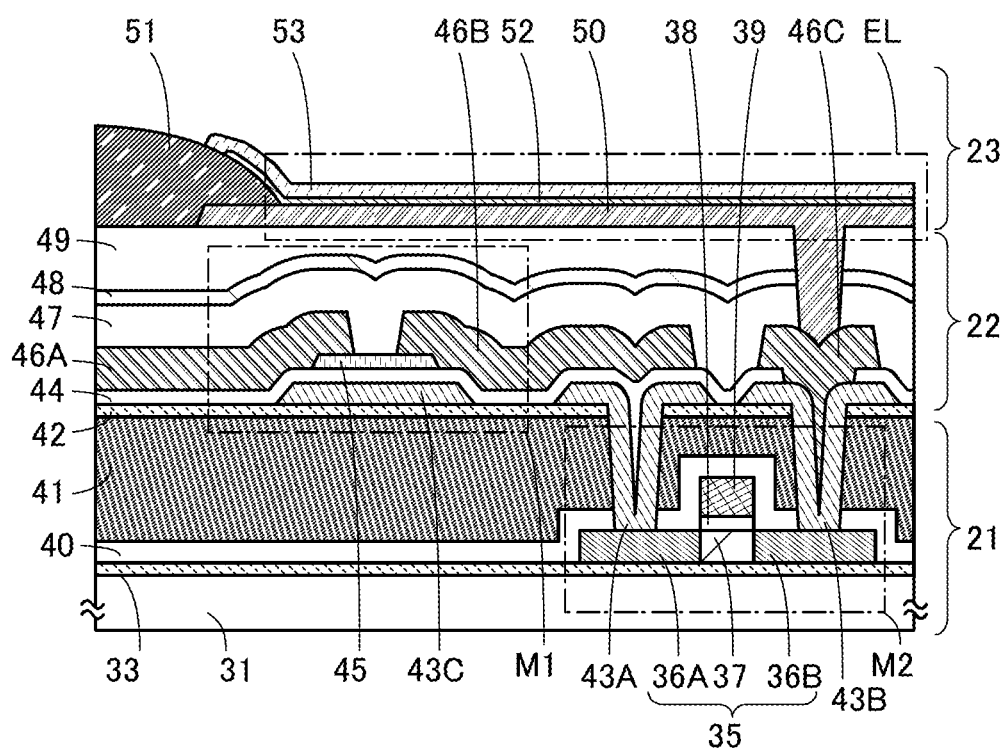
FIG. 2 is a schematic cross-sectional view illustrating one embodiment of the present invention.

FIG. 2 is a schematic cross-sectional view corresponding to FIG. 1B. In a manner similar to that of FIG. 1B, FIG. 2 illustrates the element layer 21 including the transistor M2, the element layer 22 including the transistor M1, and the element layer 23 including the light-emitting element EL.

FIG. 2 illustrates a base substrate 31, an insulating layer 33, a semiconductor layer 35, a gate insulating layer 38, a gate electrode layer 39, an insulating layer 40, an insulating layer 41, an insulating layer 42, a gate electrode layer 43C, an electrode layer 43A, an electrode layer 43B, a gate insulating layer 44, an oxide semiconductor layer 45, a source electrode 46A, a drain electrode 46B, an electrode 46C, an insulating layer 47, an insulating layer 48, an insulating layer 49, a conductive layer 50, an insulating layer 51, an EL layer 52, and a conductive layer 53. The semiconductor layer 35 includes an impurity region 36A, an impurity region 36B, and a channel formation region 37. FIG. 2 illustrates the transistor M1, the transistor M2, and the light-emitting element EL.

As the transistor M2, either an n-channel transistor or a p-channel transistor can be formed just by changing an impurity element which imparts a conductivity type and is added to the impurity region 36A and the impurity region 36B.

In FIG. 2, the transistor M2 may include a sidewall insulating layer. Furthermore, in FIG. 2, an element isolation layer may be provided so as to surround the transistor M2. Furthermore, in FIG. 2, the impurity region 36A and the impurity region 36B of the transistor M2 may each include a silicide region or the like.

Examples of conductive materials that can be used for the gate electrode layer 39, the gate electrode layer 43C, the electrode layer 43A, the electrode layer 43B, the source electrode 46A, the drain electrode 46B, the electrode 46C, the conductive layer 50, and the conductive layer 53 will be given in the description of the conductive layers in Embodiment 2.

Examples of insulating materials that can be used for the insulating layer 33, the gate insulating layer 38, the insulating layer 40, the insulating layer 41, the insulating layer 42, the gate insulating layer 44, the insulating layer 47, the insulating layer 48, the insulating layer 49, and the insulating layer 51 will be given in the description of the insulating layers in Embodiment 2.

Examples of materials that can be used for the base substrate 31, the semiconductor layer 35, the EL layer 52, the impurity region 36A, the impurity region 36B, and the channel formation region 37 will be given in the description in Embodiment 2.

The oxide semiconductor layer 45 contains In, M (M is Al, Ga, Y, or Sn), and Zn. The oxide semiconductor layer 45 preferably includes a region in which the atomic proportion of In is higher than the atomic proportion of M, for example. Note that the semiconductor device of one embodiment of the present invention is not limited thereto; the oxide semiconductor layer 45 may include a region in which the atomic proportion of In is lower than the atomic proportion of M or a region in which the atomic proportion of In is equal to the atomic proportion of M.

When the oxide semiconductor layer 45 includes a region in which the atomic proportion of In is higher than the atomic proportion of M, the transistor M1 can have high field-effect mobility. Specifically, the field-effect mobility of the transistor M1 can exceed 10 $cm^2$/Vs, preferably 30 $cm^2$/Vs.

Note that it is preferable that the semiconductor layer 35 of the transistor M2 and the oxide semiconductor layer 45 of the transistor M1 not overlap with each other as illustrated in FIG. 2.

If the semiconductor layer 35 of the transistor M2 and the oxide semiconductor layer 45 of the transistor M1 overlap with each other, operation of one of the transistors might affect the other. To avoid this influence, a structure in which the distance between the transistor M1 and the transistor M2 is increased, a structure in which a conductive layer is provided between the transistor M1 and the transistor M2, or the like can be used. However, the thickness of the display device is increased in the former structure. Thus, for example, when formed over a flexible substrate, the display device 10 may have a problem with bendability. When the latter structure is used, there may arise problems in that an additional step for forming the conductive layer is needed and the thickness of the display device is increased as in the former structure.

In contrast, in the display device 10 of one embodiment of the present invention, the transistor M1 and the transistor M2 are stacked such that the semiconductor layers of the transistors do not overlap with each other. By stacking the transistor M1 and the transistor M2, the layout flexibility of the transistors in one pixel can be increased.

The transistor M1 has a channel-etched structure in which part of the oxide semiconductor layer 45 is exposed between the source electrode 46A and the drain electrode 46B. The transistor M1 may have, instead of the channel-etched structure, a channel-protective structure. The transistor M2 has a top-gate structure in which the gate electrode layer 39 is provided over the channel formation region 37 of the semiconductor layer 35 with the gate insulating layer 38 positioned therebetween. The transistor M2 may have, instead of the top-gate structure, a double-gate structure or a multi-gate structure.

In the display device 10 of one embodiment of the present invention, as illustrated in FIG. 2, the transistor M1 and the transistor M2 included in the pixel circuit 20 are arranged in different layers, whereby the layout area of the transistor M2 can be increased. With the channel formation region including an oxide semiconductor, the transistor M1 can have a higher withstand voltage than a transistor including silicon in a channel formation region. By arranging the transistor M1 and the transistor M2 in different element layers, restrictions on the circuit layout can be eased, so that the transistor M2 can be designed to have a large channel length. This enables not only a circuit layout with the transistor M2 having adjusted current supply capability but also an increase in withstand voltage of the transistor M2. Moreover, when an impurity element is added to the channel formation region, for example, the transistor M2 can have less variation in electrical characteristics such as threshold voltage.

Figure 3A:
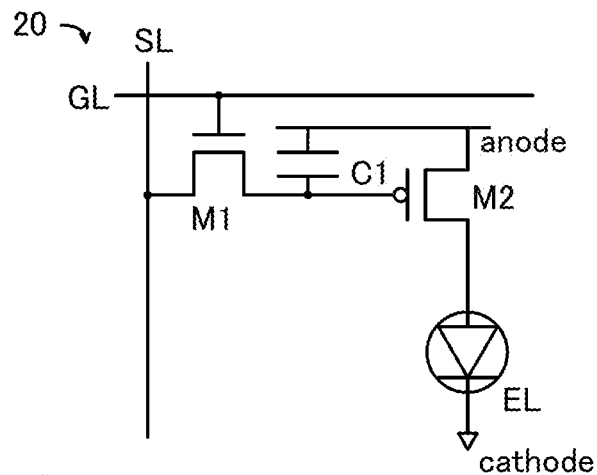
FIGS. 3A to 3C are schematic diagrams illustrating embodiments of the present invention.
Figure 3B:
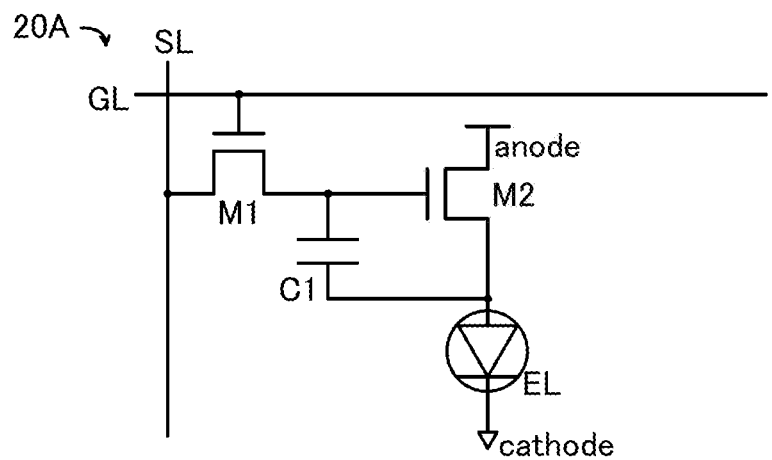

FIGS. 3A and 3B each illustrate an example of a pixel circuit. In each of FIGS. 3A and 3B, the light-emitting element EL is illustrated in the pixel circuit.

FIG. 3A illustrates the transistor M1, the transistor M2, a capacitor C1, the light-emitting element EL, the anode line "anode", the cathode line "cathode", the source line SL, and the gate line GL. The pixel circuit in FIG. 3A corresponds to a circuit in which the capacitor C1 is added to the pixel circuit 20 in FIG. 1B. Although illustrated in FIG. 3A, the capacitor C1 can be omitted by increasing the gate capacitance of the transistor M1.

FIG. 3B illustrates an example of a pixel circuit different from that in FIG. 3A. In the circuit in FIG. 3B, an n-channel transistor is used as the transistor M2, which is a p-channel transistor in FIG. 3A. A pixel circuit 20A in FIG. 3B includes the transistor M1, the transistor M2, the capacitor C1, the light-emitting element EL, the anode line "anode", the cathode line "cathode", the source line SL, and the gate line GL.

Figure 3C:
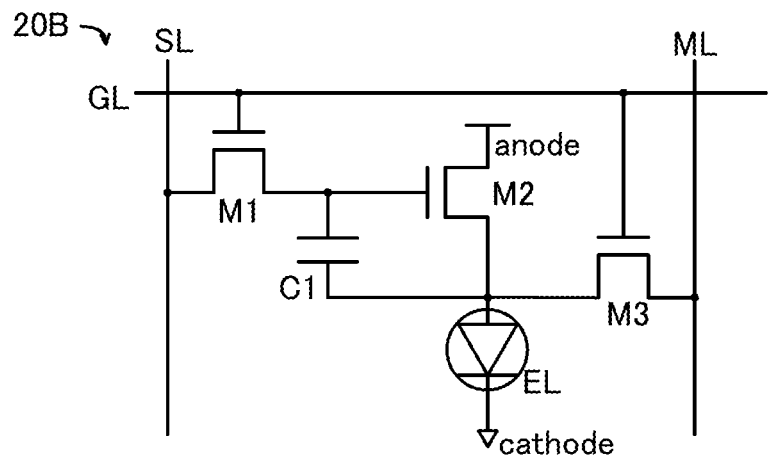

FIG. 3C illustrates an example of a pixel circuit that is different from the pixel circuits in FIGS. 3A and 3B. In the circuit in FIG. 3C, a transistor M3 and a monitoring line ML for monitoring the amount of current flowing through the transistor M2 are added to the circuit in FIG. 3B. A pixel circuit 20B in FIG. 3C includes the transistor M1, the transistor M2, the transistor M3, the capacitor C1, the light-emitting element EL, the anode line "anode", the cathode line "cathode", the monitoring line ML, the source line SL, and the gate line GL.

Figure 4:
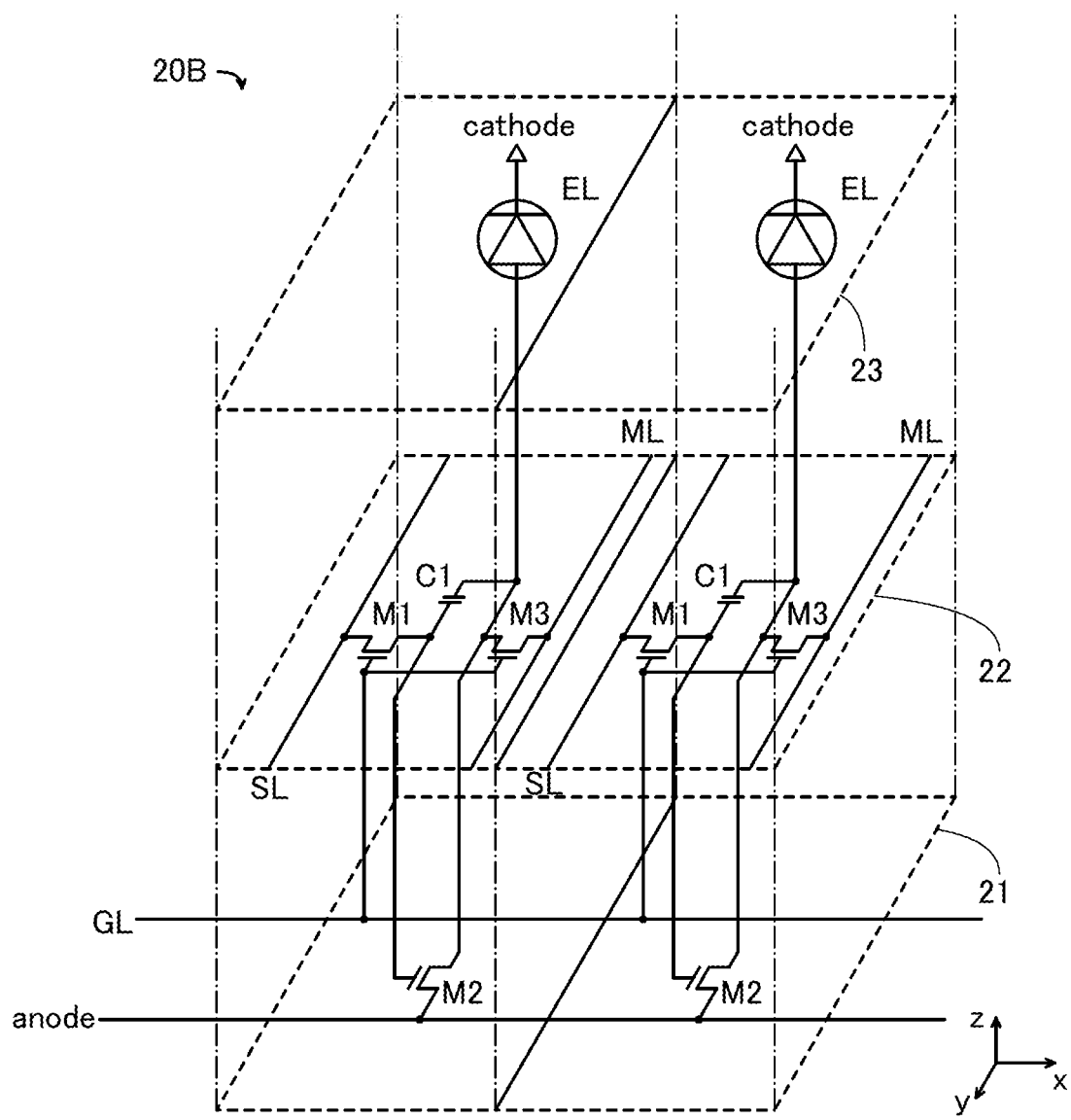
FIG. 4 is a schematic diagram illustrating one embodiment of the present invention.

FIG. 4 is a schematic circuit diagram in which the transistors M1 to M3 included in the pixel circuit 20B in FIG. 3C are illustrated in separate layers as in FIG. 1B. Note that FIG. 4 illustrates pixel circuits and light-emitting elements of two pixels.

In FIG. 4, the element layer 22 includes the transistor M3 and the monitoring line ML in addition to the source line SL, the transistor M1 which functions as a selection transistor, and the capacitor C1. The transistor M3 is an element for supplying current to the monitoring line ML and functions as a switch. Therefore, like the transistor M1, the transistor M3 is preferably provided in the element layer 22. In this structure, the transistor M2 which is provided in the element layer 21 and functions as a driver transistor can be easily designed to have a long channel length.

Figure 5A:
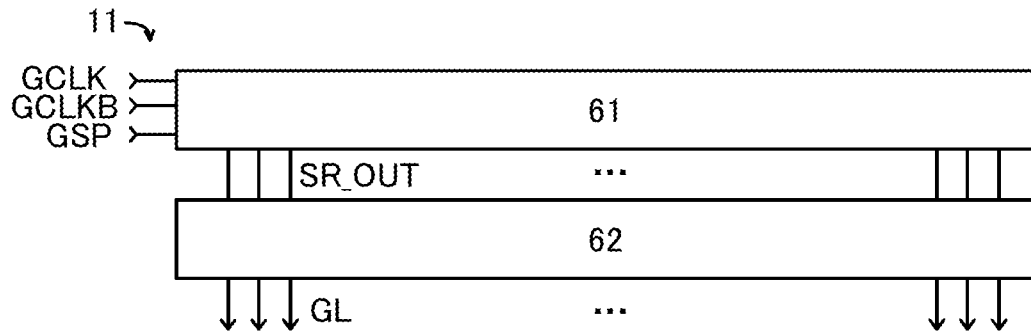
FIGS. 5A to 5D are block diagrams and circuit diagrams illustrating embodiments of the present invention.

FIG. 5A illustrates an example of the driver circuit 11 which functions as a gate line driver circuit.

FIG. 5A illustrates a shift register 61 and a buffer circuit 62. The shift register 61 includes a plurality of pulse output circuits. For example, in response to control signals such as a gate clock signal GCLK, an inverted gate clock signal GCLKB, and a gate start pulse GSP, the shift register 61 outputs a pulse signal SR_OUT to the buffer circuit 62. The buffer circuit 62 outputs a scan signal which corresponds to the pulse signal SR_OUT and has increased current supply capability to the gate line GL of each row.

Figure 5B:
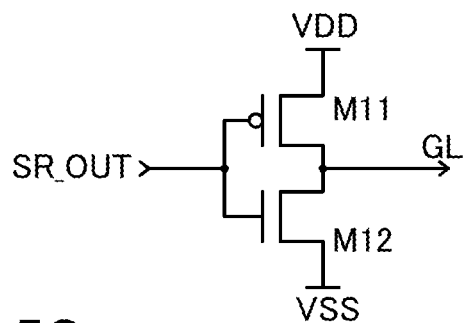

The buffer circuit 62 can be formed using transistors having the same conductivity type; however, as illustrated in FIG. 5B, a complementary metal oxide semiconductor (CMOS) circuit is preferably used. In FIG. 5B, a transistor M11 and a transistor M12 are a p-channel transistor and an n-channel transistor, respectively, through which a current for setting the voltage of the gate line GL to a voltage VDD or VSS can flow in accordance with the pulse signal SR_OUT.

Figure 5C:
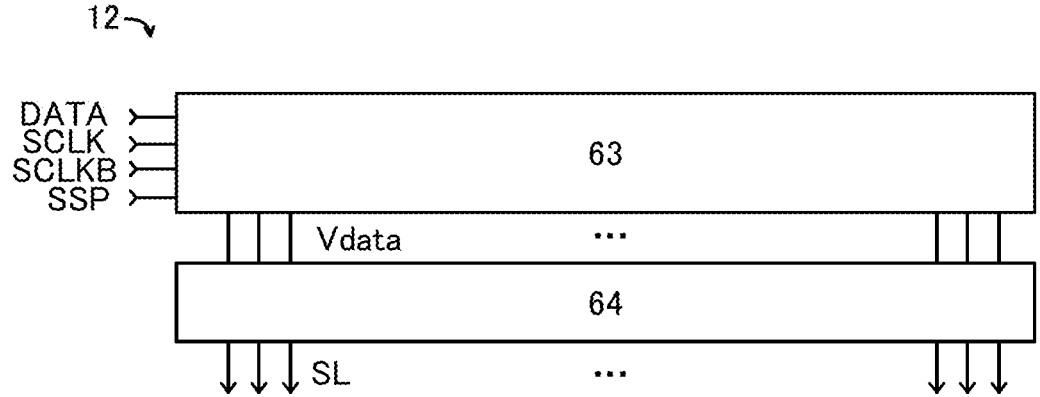

FIG. 5C illustrates an example of the driver circuit 12 which functions as a source line driver circuit.

FIG. 5C illustrates a video voltage generation circuit 63 and a buffer circuit 64. The video voltage generation circuit 63 includes a plurality of pulse output circuits, a plurality of latch circuits, and a plurality of digital/analog converter circuits. For example, in response to control signals such as a source clock signal SCLK, an inverted source clock signal SCLKB, and a source start pulse SSP, the video voltage generation circuit 63 outputs a video voltage Vdata corresponding to a data signal DATA to the source line SL of each column. The buffer circuit 64 includes an amplifier that functions as a voltage follower circuit.

Figure 5D:
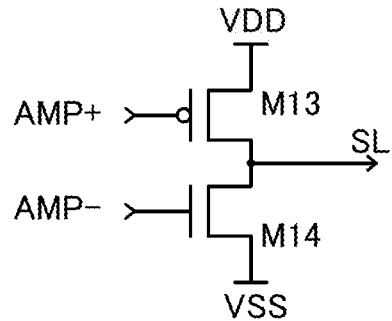

As illustrated in FIG. 5D, the buffer circuit 64 preferably has a configuration of a CMOS circuit. In FIG. 5D, a transistor M13 and a transistor M14 are a p-channel transistor and an n-channel transistor, respectively. Differential voltages AMP+ and AMP– corresponding to the video voltage Vdata are applied to the transistor M13 and the transistor M14, respectively, of an output stage of the amplifier, so that a current corresponding to the video voltage Vdata is output to the source line SL of each column.

Figure 6:
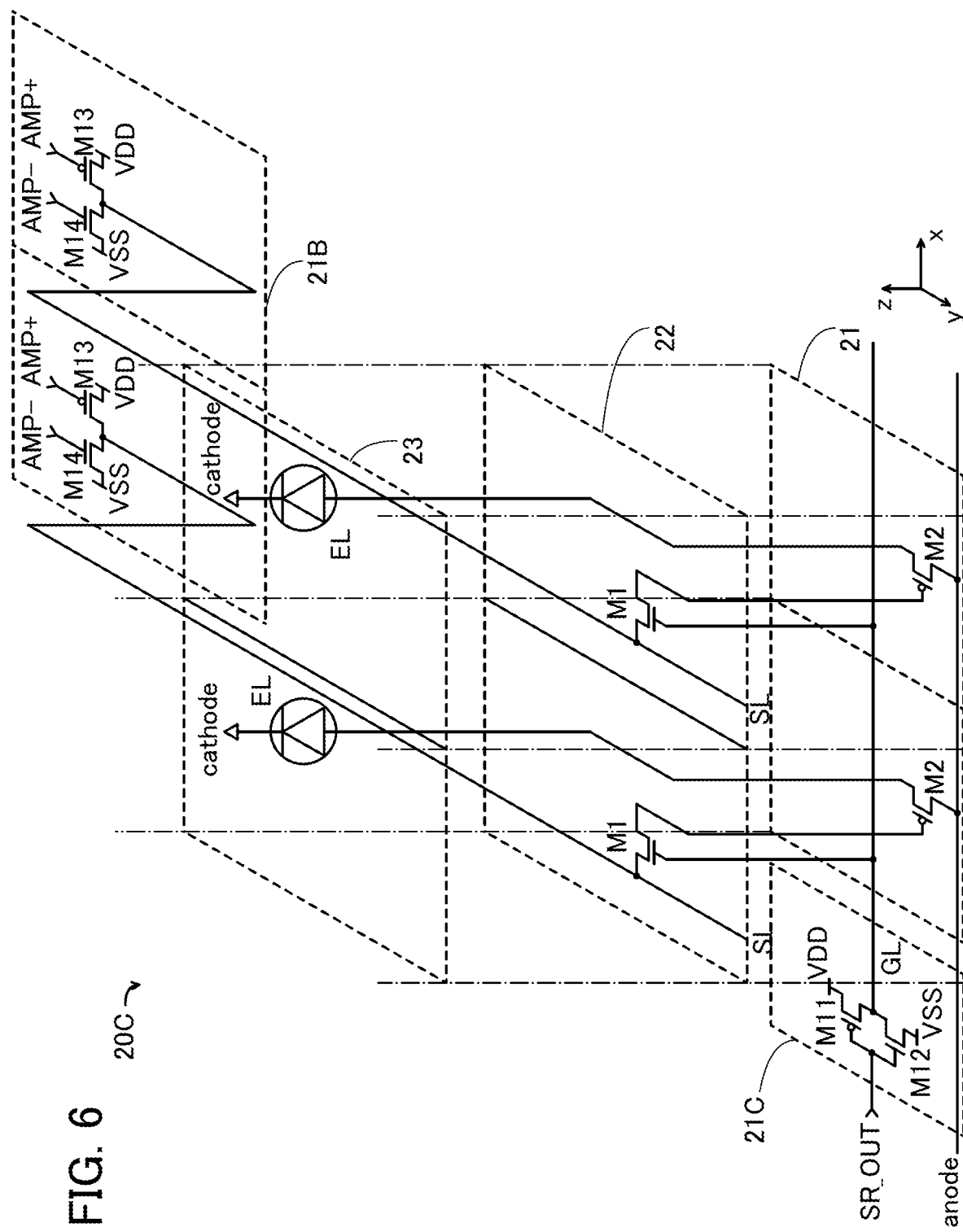
FIG. 6 is a schematic diagram illustrating one embodiment of the present invention.

FIG. 6 is a schematic circuit diagram in which an element layer 21C that includes the buffer circuit 62 in FIG. 5B connected to the gate line GL and an element layer 21B that includes the buffer circuit 64 in FIG. 5D connected to the source line SL are illustrated in separate layers as in FIG. 1B. Note that FIG. 6 illustrates pixel circuits and light-emitting elements of two pixels.

In FIG. 6, the element layers 21B and 21C can be provided in the same layer as the element layer 21 including Si transistors, with which a CMOS circuit can be easily formed. A high current needs to flow through the transistors M11 to M14 included in the buffer circuits 62 and 64; therefore, the size of each the transistors M11 to M14 can be reduced when provided in the same layer as a Si transistor with high field-effect mobility. Accordingly, the bezel of the display device can be narrowed.

In the above-described display device of one embodiment of the present invention, a transistor for driving a light-emitting element (driver transistor) is provided in a first element layer, and a transistor functioning as a switch (selection transistor) for supplying a video voltage of a source line to a gate of the driver transistor is provided in a second element layer over the first element layer. The driver transistor includes silicon in a channel formation region, like a transistor formed using a silicon on insulator (SOI) substrate. A channel formation region of the selection transistor includes a metal oxide functioning as a semiconductor (also referred to as an oxide semiconductor or an OS).

By arranging the driver transistor and the selection transistor in different layers, the layout area of the driver transistor can be increased. With the channel formation region including an oxide semiconductor, the selection transistor can have a higher withstand voltage than a transistor including silicon in a channel formation region. By arranging the selection transistor and the driver transistor in different element layers, restrictions on the circuit layout can be eased, so that the driver transistor can be designed to have a large channel length. This enables not only a circuit layout with a driver transistor having adjusted current supply capability but also an increase in withstand voltage of the driver transistor. Moreover, when an impurity element is added to the channel formation region, for example, the driver transistor can have less variation in electrical characteristics such as threshold voltage.

At least part of this embodiment can be implemented in combination with any of the other embodiments described in this specification as appropriate.

Embodiment 2

The display device of one embodiment of the present invention includes a transistor including silicon (Si transistor) and a transistor including an oxide semiconductor (OS transistor). The Si transistor can be formed using a silicon wafer, a silicon on insulator (SOI) substrate, a silicon thin film over an insulating surface, or the like. In this embodiment, a method for manufacturing the display device will be described with reference to FIGS. 7A to 7E, FIGS. 8A to 8D, FIGS. 9A to 9C, and FIGS. 10A and 10B.

In this embodiment, the following example will be described: the Si transistor is formed using an SOI substrate, and then, the OS transistor is formed.

First, a method for manufacturing the SOI substrate will be described.

Figure 7A:
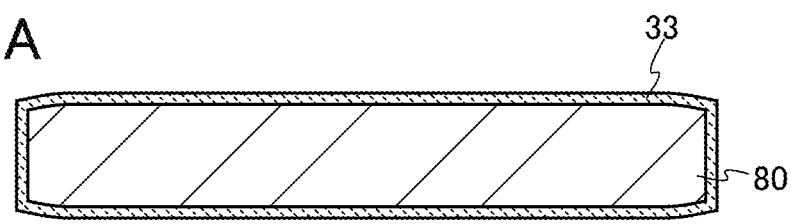
FIGS. 7A to 7E are schematic cross-sectional views illustrating one embodiment of the present invention.

As illustrated in FIG. 7A, a bond substrate 80 is cleaned, and then, the insulating layer 33 is formed on a surface of the bond substrate 80.

As the bond substrate 80, a single-crystal silicon semiconductor substrate can be used. Alternatively, the bond substrate 80 may be a semiconductor substrate of silicon having crystal lattice distortion, silicon germanium obtained by adding germanium to silicon, or the like.

In a single-crystal semiconductor substrate used as the bond substrate 80, the directions of crystal axes are preferably uniform; however, perfect crystal without any lattice defect such as a point defect, a line defect, or a plane defect is unnecessary.

The bond substrate 80 does not necessarily have a circular shape and may be processed into a shape other than a circular shape. For example, in consideration of the facts that the shape of the base substrate 31 attached later is generally a rectangle and that an exposure region of an exposure apparatus such as a reduced projection exposure apparatus is rectangular, the bond substrate 80 may be processed into a rectangular shape. The bond substrate 80 can be processed by cutting a commercially available circular single-crystal semiconductor substrate.

The insulating layer 33 may be a single insulating layer or a stack of a plurality of insulating layers. Considering that a region containing impurities is removed later, the thickness of the insulating layer 33 is preferably greater than or equal to 15 nm and less than or equal to 500 nm.

An insulating layer containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film, can be used as a film included in the insulating layer 33. Alternatively, an insulating layer containing a metal oxide such as aluminum oxide, tantalum oxide, or hafnium oxide, an insulating layer containing a metal nitride such as aluminum nitride, an insulating layer containing a metal oxynitride such as aluminum oxynitride, or an insulating layer containing a metal nitride oxide such as aluminum nitride oxide can also be used.

In this embodiment, an example in which silicon oxide formed by thermal oxidation of the bond substrate 80 is used as the insulating layer 33 will be described. In FIG. 7A, the insulating layer 33 is formed so as to cover the entire surface of the bond substrate 80; however, the insulating layer 33 may be formed on at least one surface of the bond substrate 80.

The insulating layer 33 is a film for forming a smooth hydrophilic bonding plane on the surface of the bond substrate 80. Therefore, the average surface roughness Ra of the insulating layer 33 is preferably 0.7 nm or less, further preferably 0.4 nm or less. The thickness of the insulating layer 33 is greater than or equal to 5 nm and less than or equal to 500 nm, preferably greater than or equal to 10 nm and less than or equal to 200 nm.

Figure 7B:
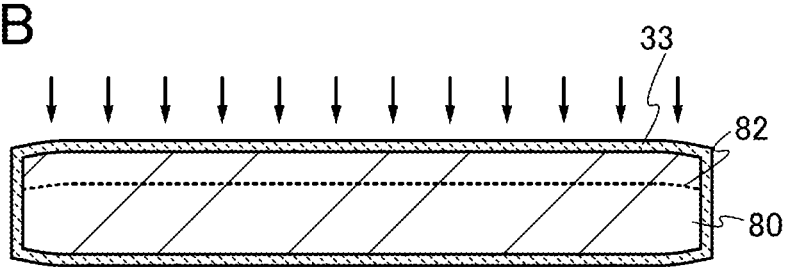

Next, as illustrated in FIG. 7B, the bond substrate 80 is irradiated with an ion beam including ions accelerated by an electric field, through the insulating layer 33 as indicated by arrows, whereby an embrittlement layer 82 having microvoids is formed in a region at a certain depth from the surface of the bond substrate 80. For example, the embrittlement layer means a layer which is locally embrittled owing to a disordered crystal structure, and the state of the embrittlement layer depends on a method for forming the embrittlement layer. Note that there may be a case where a region ranging from one surface of the bond substrate to the embrittlement layer is embrittled to some extent; however, the embrittlement layer refers to a region at which separation is performed later and its vicinity.

The depth of the region in which the embrittlement layer 82 is formed can be adjusted by the acceleration energy and the incident angle of the ion beam. The embrittlement layer 82 is formed in a region at a depth substantially the same as the average penetration depth of the ions. The thickness of a semiconductor layer 84 which is separated from the bond substrate 80 later is determined by the depth at which the ions are implanted. The depth at which the embrittlement layer 82 is formed can be, for example, greater than or equal to 50 nm and less than or equal to 500 nm, preferably greater than or equal to 50 nm and less than or equal to 200 nm from the surface of the bond substrate 80.

The ions are desirably implanted into the bond substrate 80 by an ion doping method in which mass separation is not performed because the cycle time can be shortened; however, one embodiment of the present invention may employ an ion implantation method in which mass separation is performed.

Figure 7C:
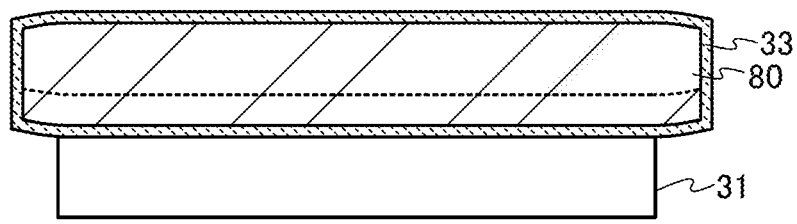

Next, as illustrated in FIG. 7C, the bond substrate 80 and the base substrate 31 are attached to each other so that the insulating layer 33 is positioned therebetween.

The attachment is performed as follows. The base substrate 31 and the insulating layer 33 on the bond substrate 80 are disposed in close contact with each other. Then, a pressure of approximately higher than or equal to 1 N/cm$^2$ and lower than or equal to 500 N/cm$^2$, preferably higher than or equal to 11 N/cm$^2$ and lower than or equal to 20 N/cm$^2$ is applied to part of the base substrate 31 and part of the bond substrate 80 stacked thereover. Bonding between the base substrate 31 and the insulating layer 33 starts from the portion to which the pressure is applied, which results in bonding of the entire surface on which the base substrate 31 and the insulating layer 33 are in close contact with each other.

The bonding is caused by Van der Waals force or a hydrogen bond; therefore, the bonding is firm even at room temperature. Since the above-described bonding can be performed at a low temperature, a variety of substrates can be used as the base substrate 31. For example, a variety of glass substrates used in the electronics industry, such as an aluminosilicate glass substrate, a barium borosilicate glass substrate, or an aluminoborosilicate glass substrate, a quartz substrate, a ceramic substrate, or a sapphire substrate, can be used as the base substrate 31. Alternatively, as the base substrate 31, a semiconductor substrate or the like of silicon, gallium arsenide, indium phosphide, or the like can be used. Further alternatively, the base substrate 31 may be a metal substrate including a stainless steel substrate. Note that a glass substrate used as the base substrate 31 preferably has a thermal expansion coefficient of greater than or equal to $25 \times 10^{-7}/°$ C. and less than or equal to $50 \times 10^{-7}/°$ C. (further preferably greater than or equal to $30 \times 10^{-7}/°$ C. and less than or equal to $40 \times 10^{-7}/°$ C.) and a strain point of higher than or equal to 580° C. and lower than or equal to 680° C. (further preferably higher than or equal to 600° C. and lower than or equal to 680° C.). When an alkali-free glass substrate is used as the glass substrate, impurity contamination of the display device can be suppressed.

As the glass substrate, a mother glass substrate developed for production of liquid crystal panels can be used. As the mother glass substrate, for example, substrates having the following sizes are known: the third generation (550 mm×650 mm), the 3.5-th generation (600 mm×720 mm), the fourth generation (680 mm×880 mm or 730 mm×920 mm), the fifth generation (1100 mm×1300 mm), the sixth generation (1500 mm×1850 mm), the seventh generation (1870 mm×2200 mm), and the eighth generation (2200 mm×2400 mm). When an SOI substrate is manufactured using a large-area mother glass substrate as the base substrate 31, the SOI substrate can have a large area.

Figure 7D:
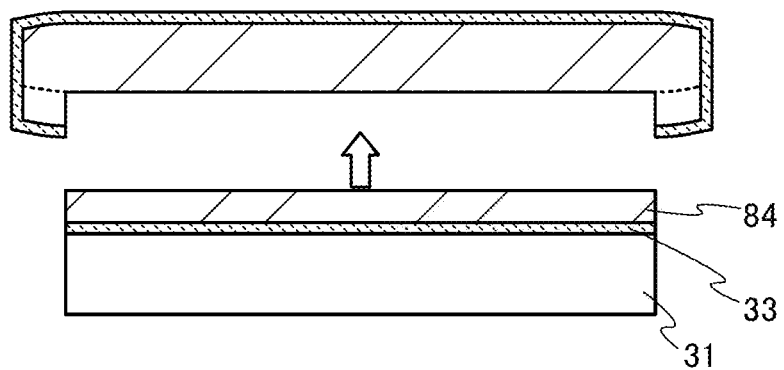

Next, heat treatment is performed, whereby microvoids adjacent to each other in the embrittlement layer 82 are combined and increase in volume. As a result, as illustrated in FIG. 7D, the semiconductor layer 84 which is part of the bond substrate 80 is separated from the bond substrate 80 along the embrittlement layer 82. Since the insulating layer 33 and the base substrate 31 are bonded to each other, the semiconductor layer 84 which is separated from the bond substrate 80 is fixed to the base substrate 31. The heat treatment for separating the semiconductor layer 84 from the bond substrate 80 is performed at a temperature which does not exceed the strain point of the base substrate 31.

For this heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. When a GRTA apparatus is used, the heating temperature can be higher than or equal to 550° C. and lower than or equal to 650° C., and the treatment time can be longer than or equal to 0.5 minutes and shorter than or equal to 60 minutes. When a resistance heating furnace is used, the heating temperature can be higher than or equal to 200° C. and lower than or equal to 650° C., and the treatment time can be longer than or equal to 2 hours and shorter than or equal to 4 hours.

Owing to the formation of the embrittlement layer 82 and the split along the embrittlement layer 82, crystal defects are formed in the semiconductor layer 84 which is in close contact with the base substrate 31, or the planarity of the surface of the semiconductor layer 84 is impaired. Thus, in one embodiment of the present invention, in order to reduce crystal defects and improve the planarity, the semiconductor layer 84 is irradiated with a laser beam after treatment for removing an oxide film such as a native oxide film which is formed on the surface of the semiconductor layer 84.

In this embodiment, the semiconductor layer 84 is immersed in DHF having a hydrogen fluoride concentration of 0.5 wt % for 110 seconds, whereby the oxide film is removed.

The semiconductor layer 84 is preferably irradiated with a laser beam having such an energy density that the semiconductor layer 84 can be partly melted. The reason for this is as follows: if the semiconductor layer 84 is completely melted, disordered nucleation occurs in the liquid-phase semiconductor layer 84; in this case, microcrystals are generated when the semiconductor layer 84 is recrystallized, so that the crystallinity decreases. By partly melting the semiconductor layer 84, crystal growth called longitudinal growth occurs from an unmelted solid portion. Due to the recrystallization by the longitudinal growth, crystal defects in the semiconductor layer 84 are reduced and the crystallinity is recovered. Note that the state in which the semiconductor layer 84 is completely melted refers to the state in which the semiconductor layer 84 is melted to the interface with the insulating layer 33 and is in a liquid phase. In contrast, the state in which the semiconductor layer 84 is partly melted refers to the state in which an upper part is melted and is in a liquid phase and a lower part is in a solid phase.

Figure 7E:
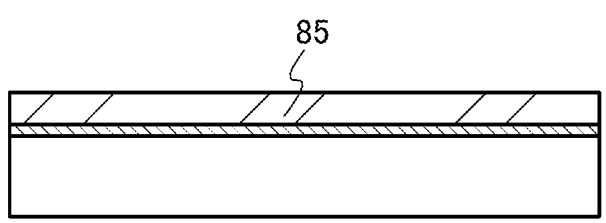

In this embodiment, in the case where the thickness of the semiconductor layer 84 is approximately 146 nm, the laser beam irradiation can be performed in the following manner. As a laser, a XeCl excimer laser (wavelength: 308 nm; pulse width: 20 nanoseconds; repetition rate: 30 Hz) is used. The cross section of the laser beam is shaped into a linear form with a size of 0.4 mm×120 mm through an optical system. The semiconductor layer 84 is irradiated with the laser beam at a scanning speed of 0.5 mm/s. Through the laser beam irradiation, a semiconductor layer 85 in which crystal defects have been repaired is formed as illustrated in FIG. 7E.

Next, after the laser beam irradiation, a surface of the semiconductor layer 85 may be etched. In the case where the surface of the semiconductor layer 85 is etched after the laser beam irradiation, the surface of the semiconductor layer 84 is not necessarily etched before the laser beam irradiation. In the case where the surface of the semiconductor layer 84 is etched before the laser beam irradiation, the surface of the semiconductor layer 85 is not necessarily etched after the laser beam irradiation. Alternatively, the surface of the semiconductor layer may be etched before and after the laser beam irradiation.

The above etching enables not only a reduction in thickness of the semiconductor layer 85 to an optimal thickness for a semiconductor element completed later but also planarization of the surface of the semiconductor layer 85.

After the laser beam irradiation, the semiconductor layer 85 is preferably subjected to heat treatment at a temperature of higher than or equal to 500° C. and lower than or equal to 650° C. This heat treatment can eliminate defects in the semiconductor layer 85, which have not been repaired by the laser beam irradiation, and can relieve distortion of the semiconductor layer 85, which has not been repaired by the laser beam irradiation. For this heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. For example, when a resistance heating furnace is used, the heat treatment may be performed at 600° C. for 4 hours.

Figure 8A:
FIGS. 8A to 8D are schematic cross-sectional views illustrating one embodiment of the present invention.

Next, as illustrated in FIG. 8A, the semiconductor layer 85 which is attached to the insulating layer 33 on the base substrate 31 is partly etched to form the island-shaped semiconductor layer 35.

To control the threshold voltage, a p-type impurity such as boron, aluminum, or gallium or an n-type impurity such as phosphorus or arsenic may be added to the semiconductor layer 35.

Figure 8B:
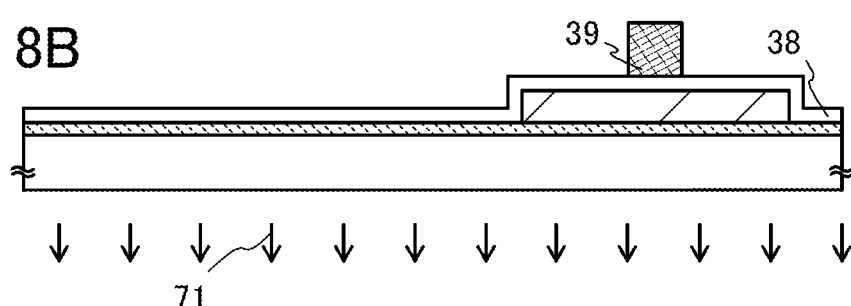

Next, the gate insulating layer 38 is formed so as to cover the semiconductor layer 35 as illustrated in FIG. 8B. The gate insulating layer 38 can be formed by oxidation or nitridation of a surface of the semiconductor layer 35 by high-density plasma treatment. The high-density plasma treatment is performed, for example, using a mixed gas of a rare gas such as He, Ar, Kr, or Xe and oxygen, nitrogen oxide, ammonia, nitrogen, hydrogen, or the like. In this case, when plasma is excited by introduction of microwaves, high-density plasma with a low electron temperature can be generated.

Since the oxidation or nitridation of the semiconductor film by the high-density plasma treatment proceeds by a solid-phase reaction, the interface state density between the gate insulating layer 38 and the semiconductor layer 35 can be significantly reduced. Furthermore, since the semiconductor layer 35 is directly oxidized or nitrided by the high-density plasma treatment, variation in thickness of the formed insulating layer can be suppressed. In the case where the semiconductor film has crystallinity, by oxidation of the surface of the semiconductor film by a solid-phase reaction in the high-density plasma treatment, crystal grain boundaries can be prevented from being locally oxidized at high speed; thus, a uniform gate insulating layer with low interface state density can be formed. A transistor whose gate insulating layer partly or entirely includes the insulating layer formed by the high-density plasma treatment can have less variation in characteristics.

Alternatively, the gate insulating layer 38 may also be formed by thermal oxidation of the semiconductor layer 35. Further alternatively, as the gate insulating layer 38, a single layer or a stack including a film containing silicon oxide, silicon nitride oxide, silicon oxynitride, silicon nitride, hafnium oxide, aluminum oxide, or tantalum oxide may be formed by a plasma CVD method, a sputtering method, or the like.

A conductive layer is formed over the gate insulating layer 38 and then processed into a predetermined shape, so that the gate electrode layer 39 is formed over the semiconductor layer 35. The gate electrode layer 39 can be formed by a CVD method, a sputtering method, or the like. For the gate electrode layer 39, tantalum (Ta), tungsten (W), titanium (Ti), molybdenum (Mo), aluminum (Al), copper (Cu), chromium (Cr), niobium (Nb), or the like can be used. Moreover, an alloy containing the above metal as a main component or a compound containing the above metal may be used. Alternatively, the gate electrode layer 39 may be formed using a semiconductor such as polycrystalline silicon doped with an impurity element such as phosphorus, which imparts conductivity to the semiconductor film.

Although the gate electrode layer 39 is formed of a single-layer conductive layer in this embodiment, this embodiment is not limited to this structure. The gate electrode layer 39 may be formed of stacked conductive layers.

In the case where two conductive layers are combined, tantalum nitride or tantalum can be used for a first layer, and tungsten can be used for a second layer. Besides, the following combinations can be given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive layers are formed. As another example of a combination of two conductive layers, silicon doped with an impurity which imparts n-type conductivity and nickel silicide or silicon doped with an impurity which imparts n-type conductivity and tungsten silicide can be used. In the case of a three-layer structure in which three conductive layers are stacked, a stacked structure of a molybdenum film, an aluminum film, and a molybdenum film is preferably employed.

Figure 8C:
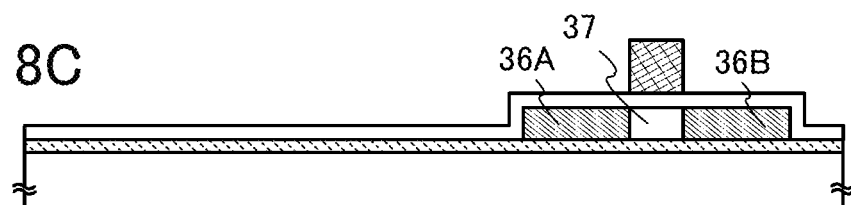

Next, as illustrated in FIG. 8C, an impurity element 71 is added using the gate electrode layer 39 as a mask. In the semiconductor layer 35, the impurity region 36A and the impurity region 36B which are p-type impurity regions and the channel formation region 37 are formed. In this embodiment, to form a p-channel transistor, for example, an impurity element which imparts p-type conductivity (e.g., boron) is added to the semiconductor layer 35. In the case of an n-channel transistor, an impurity element which imparts n-type conductivity (e.g., phosphorus or arsenic) is added to the semiconductor layer 35.

Figure 8D:
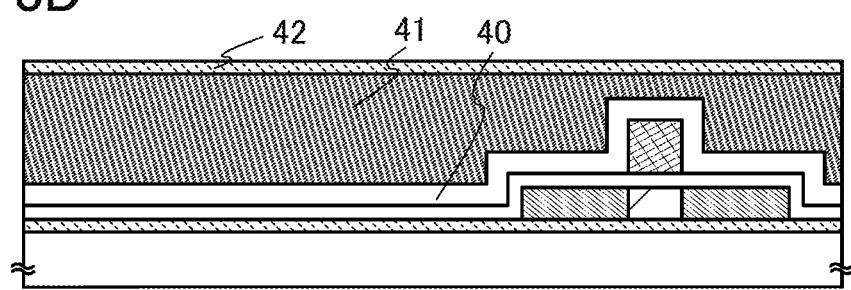

Next, as illustrated in FIG. 8D, the insulating layer 40 is formed so as to cover the gate electrode layer 39 and the gate insulating layer 38. By providing the insulating layer 40, a surface of the gate electrode layer 39 can be prevented from being oxidized during heat treatment. Specifically, it is desirable to use silicon nitride, silicon nitride oxide, silicon oxynitride, aluminum nitride, aluminum oxide, silicon oxide, or the like for the insulating layer 40. In this embodiment, an approximately 50-nm-thick silicon oxynitride film is used as the insulating layer 40.

Note that the insulating layer 41 and the insulating layer 42 are stacked over the insulating layer 40 in this embodiment; however, the insulating layer formed over the insulating layer 40 may be a single-layer insulating layer or a stack of three or more insulating layers.

A surface of the insulating layer 42 may be planarized by chemical mechanical polishing (CMP) or the like.

Figure 9A:
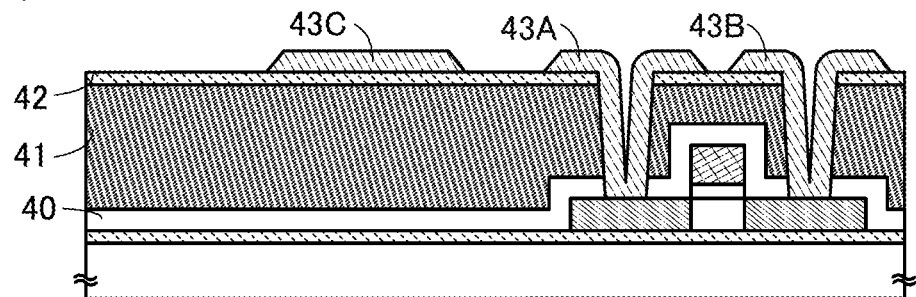
FIGS. 9A to 9C are schematic cross-sectional views illustrating one embodiment of the present invention.

Next, as illustrated in FIG. 9A, the gate electrode layer 43C, the electrode layer 43A, and the electrode layer 43B are formed over the insulating layer 42.

As the gate electrode layer 43C, the electrode layer 43A, and the electrode layer 43B, a single layer or a stack including a conductive layer containing a metal material such as molybdenum, titanium, chromium, tantalum, tungsten, neodymium, or scandium, an alloy material which contains any of these metal materials as a main component, or a nitride of any of these metals can be used. Note that aluminum or copper can also be used as such a metal material if aluminum or copper can withstand a temperature of heat treatment performed in a later step. Aluminum or copper is preferably combined with a high-melting-point metal material to avoid problems of heat resistance and corrosion. As the high-melting-point metal material, molybdenum, titanium, chromium, tantalum, tungsten, neodymium, scandium, or the like can be used.

For example, as a two-layer structure of the gate electrode layer 43C, the electrode layer 43A, and the electrode layer 43B, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode layer 43C, the electrode layer 43A, and the electrode layer 43B, the following structure is preferable: a stacked structure in which an aluminum film, an aluminum-silicon alloy film, an aluminum-titanium alloy film, or an aluminum-neodymium alloy film is used as a middle layer and any of a tungsten film, a tungsten nitride film, a titanium nitride film, and a titanium film is used as a top layer and a bottom layer.

Furthermore, a light-transmitting conductive oxide layer of indium oxide, indium tin oxide, indium oxide-zinc oxide, zinc oxide, zinc aluminum oxide, zinc aluminum oxynitride, zinc gallium oxide, or the like can be used as the gate electrode layer 43C, the electrode layer 43A, and the electrode layer 43B.

The gate electrode layer 43C, the electrode layer 43A, and the electrode layer 43B each have a thickness of 10 nm to 400 nm, preferably 100 nm to 200 nm. In this embodiment, a conductive layer for the gate electrode is formed to a thickness of 150 nm by a sputtering method using a tungsten target, and then, the conductive layer is processed into a desired shape by etching; thus, the gate electrode layer 43C, the electrode layer 43A, and the electrode layer 43B are formed. Note that end portions of the formed gate electrode are preferably tapered, in which case coverage with a gate insulating layer stacked thereover is improved. Note that a resist mask may be formed by an inkjet method. Formation of the resist mask by an inkjet method needs no photomask; thus, manufacturing cost can be reduced.

Figure 9B:
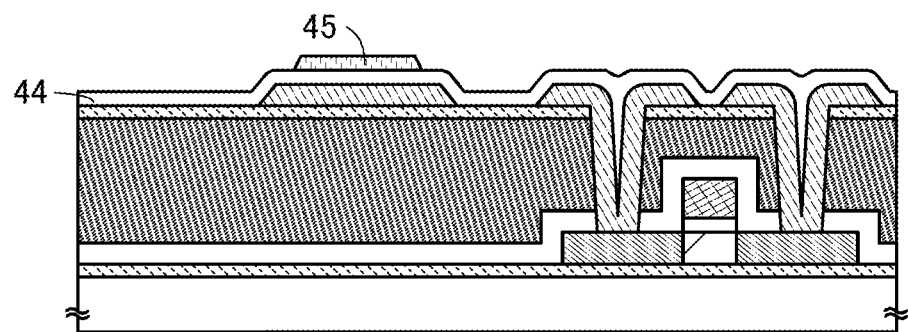

Next, as illustrated in FIG. 9B, the gate insulating layer 44 is formed over the gate electrode layer 43C, the electrode layer 43A, and the electrode layer 43B. As the gate insulating layer 44, a single layer or a stack including any of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film can be formed by a plasma CVD method, a sputtering method, or the like. It is preferable that the gate insulating layer 44 contain impurities such as moisture and hydrogen as little as possible. In the case of depositing a silicon oxide film by a sputtering method, a silicon target or a quartz target is used as a target, and oxygen or a mixed gas of oxygen and argon is used as a sputtering gas.

An i-type or substantially i-type oxide semiconductor (highly purified oxide semiconductor) obtained by removal of impurities is very sensitive to an interface state and interface charge; thus, an interface between the highly purified oxide semiconductor and the gate insulating layer 44 is important. Therefore, the gate insulating layer (GI) which is in contact with the highly purified oxide semiconductor needs high quality.

For example, high-density plasma CVD using microwaves (2.45 GHz) is preferable because a dense high-quality insulating layer having a high withstand voltage can be formed. When the highly purified oxide semiconductor and the high-quality gate insulating layer are in close contact with each other, interface states can be reduced and interface characteristics can be improved.

Needless to say, another deposition method such as a sputtering method or a plasma CVD method can be used as long as a high-quality insulating layer can be formed as the gate insulating layer. Alternatively, an insulating layer whose film quality as a gate insulating layer and characteristics of the interface between the gate insulating layer and the oxide semiconductor are improved by heat treatment after deposition may be used. In any case, an insulating layer which has favorable film quality as a gate insulating layer and can form a favorable interface with low state density between the gate insulating layer and the oxide semiconductor is used.

The gate insulating layer 44 may have a structure in which an insulating layer formed using a material having a high barrier property and an insulating layer having a low nitrogen content, such as a silicon oxide film or a silicon oxynitride film, are stacked. In this case, the insulating layer such as a silicon oxide film or a silicon oxynitride film is formed between the insulating layer having a high barrier property and the oxide semiconductor layer. As the insulating layer having a high barrier property, a silicon nitride film, a silicon nitride oxide film, an aluminum nitride film, or an aluminum nitride oxide film can be used, for example. The insulating layer having a high barrier property is used, so that an impurity in an atmosphere, such as moisture or hydrogen, or an impurity contained in the substrate, such as an alkali metal or a heavy metal, can be prevented from entering the oxide semiconductor layer, the gate insulating layer 44, the interface between the oxide semiconductor layer and another insulating layer, or the vicinity thereof. In addition, the insulating layer having a low nitrogen content, such as a silicon oxide film or a silicon oxynitride film, is formed in contact with the oxide semiconductor layer, so that the insulating layer having a high barrier property can be prevented from being in direct contact with the oxide semiconductor layer.

For example, a 100-nm-thick stack may be formed as the gate insulating layer 44 as follows: a silicon nitride film ($SiN_y$ (y>0)) with a thickness of greater than or equal to 50 nm and less than or equal to 200 nm is formed by a sputtering method as a first gate insulating layer, and a silicon oxide film ($SiO_x$ (x>0)) with a thickness of greater than or equal to 5 nm and less than or equal to 300 nm is stacked as a second gate insulating layer over the first gate insulating layer. The thickness of the gate insulating layer 44 may be set as appropriate in accordance with characteristics needed for the transistor and may be approximately 350 nm to 400 nm.

In this embodiment, the gate insulating layer 44 is formed to have a structure in which a 100-nm-thick silicon oxide film formed by a sputtering method is stacked over a 50-nm-thick silicon nitride film formed by a sputtering method.

In order that the gate insulating layer 44 may contain hydrogen, a hydroxyl group, and moisture as little as possible, it is preferable that an impurity such as moisture or hydrogen adsorbed on the base substrate 31 be released and removed by preheating the base substrate 31 provided with the gate electrode layer 43C, the electrode layer 43A, and the electrode layer 43B in a preheating chamber of a sputtering apparatus, as a pretreatment for deposition. The preheating temperature is higher than or equal to 100° C. and lower than or equal to 400° C., preferably higher than or equal to 150° C. and lower than or equal to 300° C. As an exhaust unit provided in the preheating chamber, a cryopump is preferable. Note that this preheating treatment can be omitted.

Next, over the gate insulating layer 44, an oxide semiconductor layer having a thickness of greater than or equal to 2 nm and less than or equal to 200 nm, preferably greater than or equal to 3 nm and less than or equal to 50 nm, further preferably greater than or equal to 3 nm and less than or equal to 20 nm is formed. The oxide semiconductor layer is deposited by a sputtering method using an oxide semiconductor target. Moreover, the oxide semiconductor layer can be formed by a sputtering method in a rare gas (e.g., argon) atmosphere, an oxygen atmosphere, or a mixed atmosphere of a rare gas (e.g., argon) and oxygen. Then, as illustrated in FIG. 9B, the oxide semiconductor layer is processed into a desired shape by etching or the like, so that the island-shaped oxide semiconductor layer 45 is formed over the gate insulating layer 44 so as to overlap with the gate electrode layer 43C.

The above-mentioned oxide semiconductor can be used for the oxide semiconductor layer.

In this embodiment, as the oxide semiconductor layer, a 30-nm-thick In—Ga—Zn—O-based non-single-crystal film obtained by a sputtering method using a metal oxide target containing indium (In), gallium (Ga), and zinc (Zn) is used. As the target, a metal oxide target having a composition of metals of In:Ga:Zn=1:1:0.5, In:Ga:Zn=1:1:1, or In:Ga:Zn=1:1:2 can be used, for example. The target may contain $SiO_2$ at higher than or equal to 2 wt % and lower than or equal to 10 wt %. The filling rate of the metal oxide target containing In, Ga, and Zn is higher than or equal to 90% and lower than or equal to 100%, preferably higher than or equal to 95% and lower than or equal to 99.9%. With the use of a metal oxide target with a high filling rate, a dense oxide semiconductor layer is deposited.

Figure 9C:
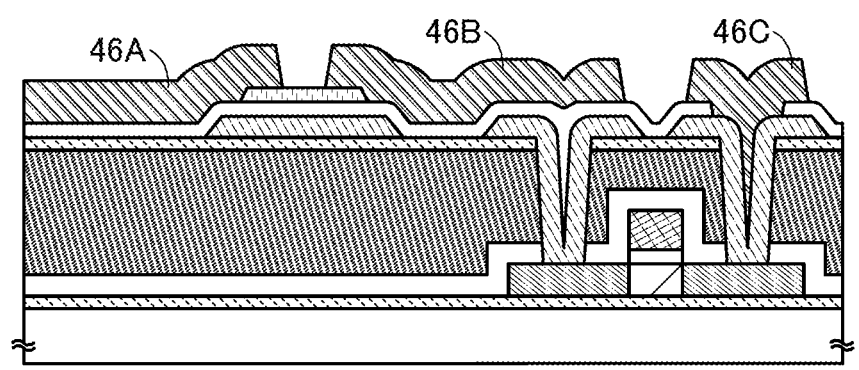

Next, the gate insulating layer 44 is partly etched to form a contact hole reaching the electrode layer 43B. Subsequently, a conductive layer used for the source electrode or the drain electrode (including a wiring formed in the same layer as the source electrode or the drain electrode) is formed over the oxide semiconductor layer 45 by a sputtering method or a vacuum evaporation method; then, the conductive layer is patterned by etching or the like. Thus, as illustrated in FIG. 9C, the source electrode 46A and the drain electrode 46B over the oxide semiconductor layer 45, and the electrode 46C are formed.

As a material of the conductive layer to be the source electrode and the drain electrode (including the wiring formed in the same layer as the source electrode and the drain electrode), an element selected from Al, Cr, Cu, Ta, Ti, Mo, and W, an alloy containing the above element as a component, an alloy film containing a combination of any of the above elements, or the like can be used. Alternatively, a stacked structure may be employed in which a film of a high-melting-point metal such as Cr, Ta, Ti, Mo, or W is provided over or under a metal film of Al, Cu, or the like. Furthermore, when an Al material to which an element for preventing hillocks or whiskers in an Al film, such as Si, Ti, Ta, W, Mo, Cr, Nd, Sc, or Y, is added is used, the heat resistance can be improved.

Furthermore, the conductive layer may have a single-layer structure or a stacked structure of two or more layers. For example, a single-layer structure of an aluminum film containing silicon, a two-layer structure in which a titanium film is stacked over an aluminum film, and a three-layer structure in which a titanium film, an aluminum film, and a titanium film are stacked in this order can be given.

Figure 10A:
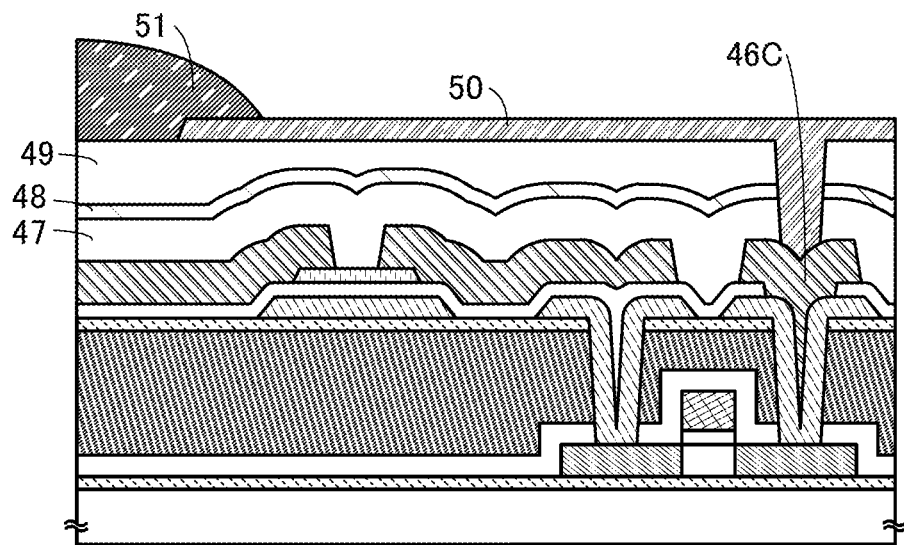
FIGS. 10A and 10B are schematic cross-sectional views illustrating one embodiment of the present invention.

Next, as illustrated in FIG. 10A, the insulating layer 47, the insulating layer 48, and the insulating layer 49 are formed so as to cover the source electrode 46A, the drain electrode 46B, and the electrode 46C.

As each of the insulating layers 47 to 49, an insulating layer including at least one of the following films can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Next, as illustrated in FIG. 10A, an opening reaching the electrode 46C is formed in desired regions of the insulating layer 47, the insulating layer 48, and the insulating layer 49. After that, the conductive layer 50 is formed over the insulating layer 49. As the conductive layer 50, a stack of a 10-nm-thick ITSO film, a 200-nm-thick reflective metal film (here, a metal film containing silver, palladium, and copper), and a 10-nm-thick ITSO film is used. An ITSO film refers to an oxide containing indium, tin, and silicon (also referred to as ITSO).

Next, as illustrated in FIG. 10A, the island-shaped insulating layer 51 is formed over the insulating layer 49 and the conductive layer 50. As the insulating layer 51, a 1.5-µm-thick polyimide-based photosensitive organic resin film is used.

Figure 10B:
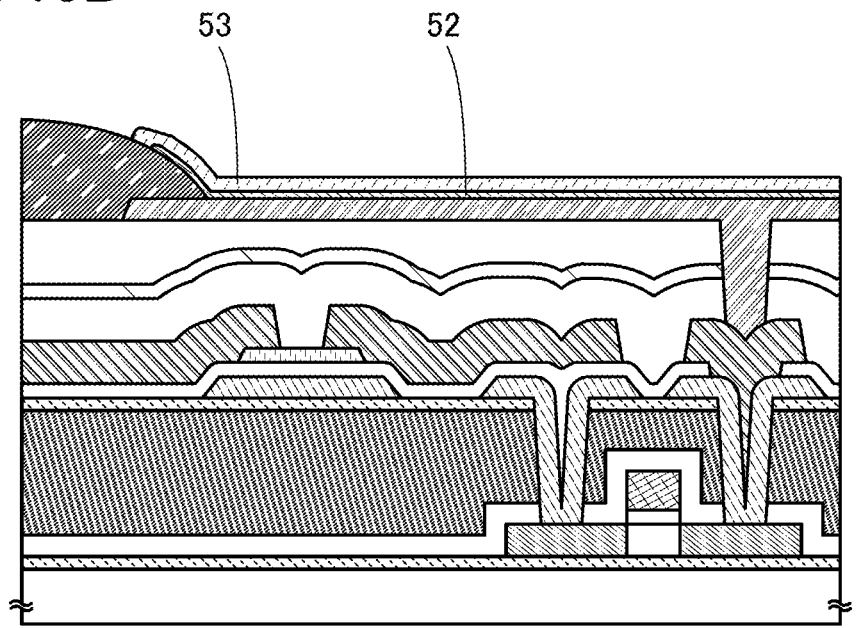

Next, as illustrated in FIG. 10B, the EL layer 52 is formed over the conductive layer 50 and the insulating layer 49, and then, the conductive layer 53 is formed over the insulating layer 49 and the EL layer 52; thus, a light-emitting element is formed.

The EL layer 52 includes at least a light-emitting layer. In addition to the light-emitting layer, the EL layer 52 may include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

For the EL layer 52, either a low molecular compound or a high molecular compound can be used, and an inorganic compound may also be used. Each of the layers included in the EL layer 52 can be formed by an evaporation method (including a vacuum evaporation method), a transfer method, a printing method, an inkjet method, a coating method, or the like.

In the case where a light-emitting element emitting white light is used as the light-emitting element, the EL layer 52 preferably contains two or more kinds of light-emitting substances. For example, white emission can be obtained by selecting two or more light-emitting substances such that the light-emitting substances emit light of complementary colors. Specifically, it is preferable to select two or more light-emitting substances from those emitting light of red (R), green (G), blue (B), yellow (Y), orange (O), and the like and those emitting light including two or more spectral components of R, G, and B. The light-emitting element preferably emits light with a spectrum having two or more peaks in the visible wavelength range (e.g., 350 nm to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer 52. For example, the plurality of light-emitting layers in the EL layer 52 may be stacked in contact with each other, or a region which contains no light-emitting material may be provided between the stacked light-emitting layers. For example, between a fluorescent layer and a phosphorescent layer, a region which contains the same material (e.g., a host material or an assist material) as the fluorescent layer or the phosphorescent layer and contains no light-emitting material may be provided. This facilitates the manufacture of the light-emitting element and reduces the drive voltage.

The light-emitting element EL may be a single element including one EL layer 52 or a tandem element in which a plurality of EL layers 52 is stacked with a charge generation layer positioned therebetween.

The conductive layer 53 is preferably formed using a metal, an alloy, or a conductive compound having a low work function (a work function of 3.8 eV or lower), a mixture thereof, or the like. For the conductive layer 53, for example, an element belonging to Group 1 or 2 of the periodic table, that is, an alkali metal such as Li or Cs or an alkaline earth metal such as Mg, Ca, or Sr can be used. As other specific examples of the cathode material, an alloy containing an alkali metal or an alkaline earth metal (e.g., Mg:Ag or Al:Li), a metal compound containing an alkali metal or an alkaline earth metal (e.g., LiF, CsF, or $CaF_2$), and a transition metal including a rare earth metal can be given.

Through the above process, the display device illustrated in FIG. 2 can be formed.

Note that the structures and the methods described in this embodiment can be used in appropriate combination with any of the structures and the methods described in the other embodiments.

Embodiment 3

In this embodiment, a display module for which the display device of one embodiment of the present invention can be used will be described. A display module including the display device of one embodiment of the present invention will be described with reference to FIG. 11. Since the display module includes the display device of one embodiment of the present invention, its display portion can have an extremely high resolution.

Figure 11:
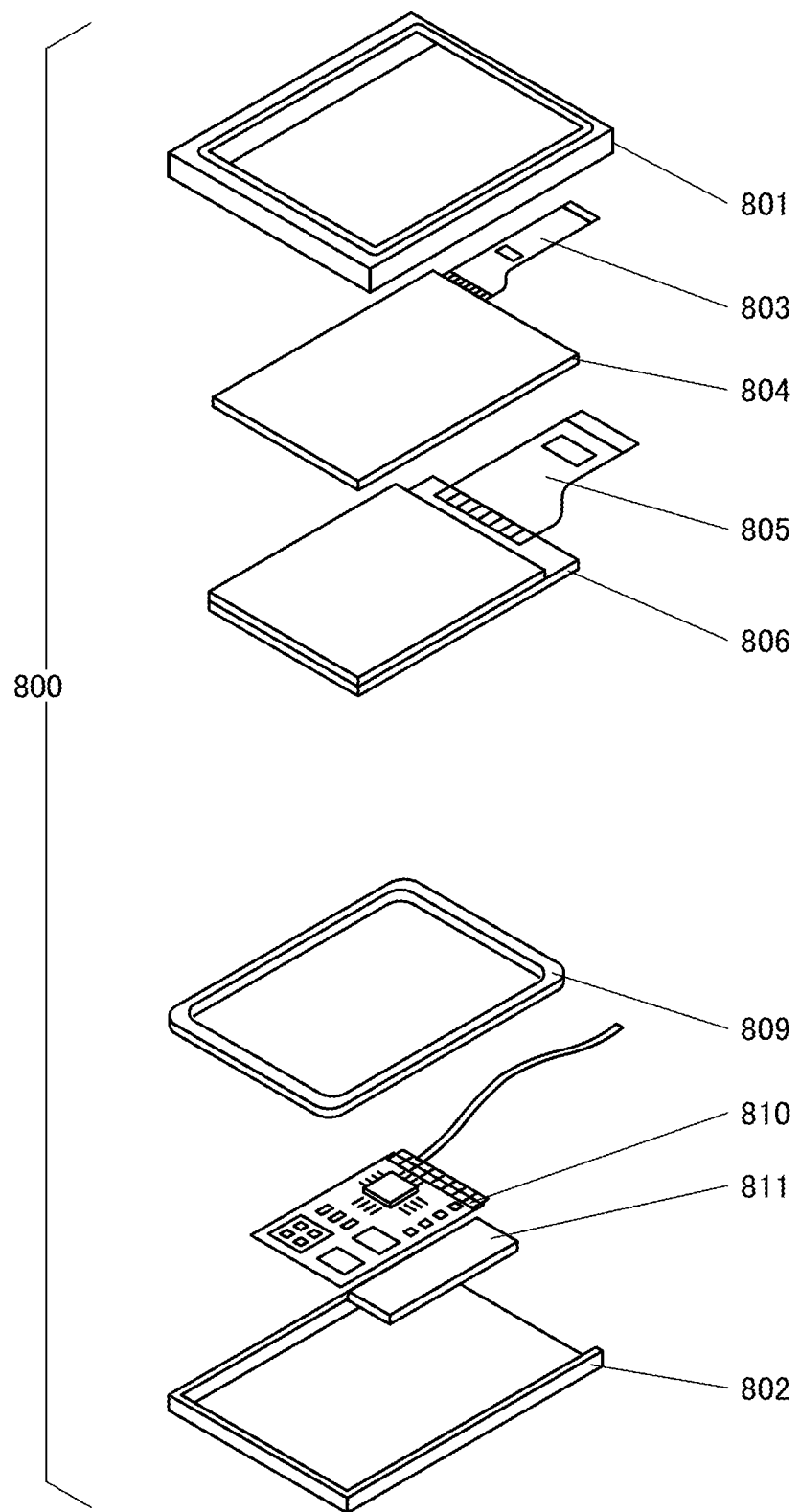
FIG. 11 illustrates a display module.

In a display module 800 illustrated in FIG. 11, a touch panel 804 connected to an FPC 803, a display panel 806 connected to an FPC 805, a frame 809, a printed board 810, and a battery 811 are provided between an upper cover 801 and a lower cover 802.

The display device of one embodiment of the present invention can be used for, for example, the display panel 806. Therefore, a display portion with an extremely high resolution can be obtained.

The shapes and sizes of the upper cover 801 and the lower cover 802 can be changed as appropriate in accordance with the sizes of the touch panel 804 and the display panel 806.

The touch panel 804 can be a resistive touch panel or a capacitive touch panel and can be stacked over the display panel 806. Alternatively, a counter substrate (sealing substrate) of the display panel 806 can have a touch panel function. Further alternatively, a photosensor can be provided in each pixel of the display panel 806 so that an optical touch panel is obtained.

The frame 809 protects the display panel 806 and functions as an electromagnetic shield for blocking electromagnetic waves generated by the operation of the printed board 810. The frame 809 may also function as a radiator plate.

The printed board 810 includes a power supply circuit and a signal processing circuit for outputting a video signal and a clock signal. As a power source for supplying power to the power supply circuit, an external commercial power source or the battery 811 provided separately may be used. The battery 811 can be omitted in the case of using a commercial power source.

The display module 800 may be additionally provided with a polarizing plate, a retardation plate, a prism sheet, or the like.

At least part of this embodiment can be implemented in combination with any of the other embodiments described in this specification as appropriate.

Embodiment 4

In this embodiment, examples of an electronic device for which the display device of one embodiment of the present invention can be used will be described.

An electronic device can be manufactured using the display device of one embodiment of the present invention. With the use of the display device of one embodiment of the present invention, an electronic device including a display portion with an extremely high resolution can be manufactured.

Examples of the electronic device include a television set, a desktop or laptop personal computer, a monitor of a computer or the like, a digital camera, a digital video camera, a digital photo frame, a mobile phone, a portable game console, a portable information terminal, an audio reproducing device, and a large game machine such as a pachinko machine.

The electronic device of one embodiment of the present invention can be installed along a curved inner/outer wall of a house or a building or a curved interior/exterior surface of an automobile.

The electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium-ion polymer battery) using a gel electrolyte, a nickel hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, information, or the like can be displayed on the display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions, for example, a function of displaying a variety of information (e.g., a still image, a moving image, and a text image) on the display portion, a touch panel function, a function of displaying a calendar, the date, the time, or the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images where parallax is considered on the plurality of display portions, or the like. Furthermore, an electronic device including an image receiving portion can have a function of taking a still image or a moving image, a function of automatically or manually correcting a shot image, a function of storing a shot image in a recording medium (an external recording medium or a recording medium incorporated in the electronic device), a function of displaying a shot image on a display portion, or the like. Note that the electronic device of one embodiment of the present invention can have a variety of functions which are not limited to these examples.

FIGS. 12A to 12E illustrate examples of electronic devices each including a curved display portion 7000. The display portion 7000 has a pixel including a light-emitting element and a curved display surface on which an image can be displayed. The display portion 7000 may have flexibility.

The display portion 7000 includes the display device or the like of one embodiment of the present invention. According to one embodiment of the present invention, an electronic device including a display portion with an extremely high resolution can be provided.

Figure 12A:
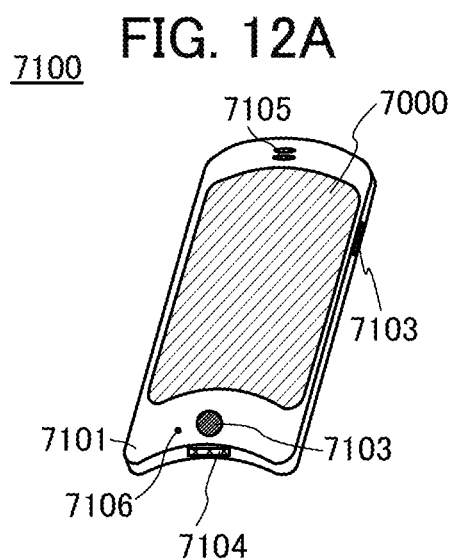
FIGS. 12A to 12E each illustrate an electronic device of an embodiment.
Figure 12B:
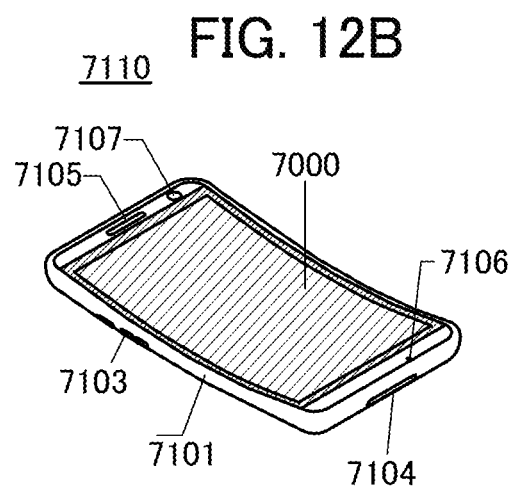

FIGS. 12A and 12B each illustrate an example of a mobile phone. A mobile phone 7100 illustrated in FIG. 12A and a mobile phone 7110 illustrated in FIG. 12B each include a housing 7101, the display portion 7000, an operation button 7103, an external connection port 7104, a speaker 7105, a microphone 7106, and the like. The mobile phone 7110 illustrated in FIG. 12B further includes a camera 7107.

Each of the mobile phones includes a touch sensor in the display portion 7000. Operations such as making a call and inputting texts can be performed by touch on the display portion 7000 with a finger, a stylus, or the like.

With the operation button 7103, power can be turned on or off. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). The direction of display on the screen can also be changed by touch on the display portion 7000, operation with the operation button 7103, sound input using the microphone 7106, or the like.

Figure 12C:
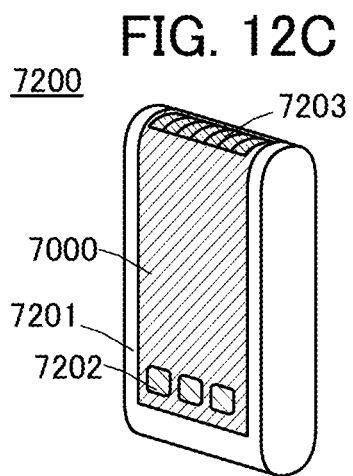
Figure 12D:
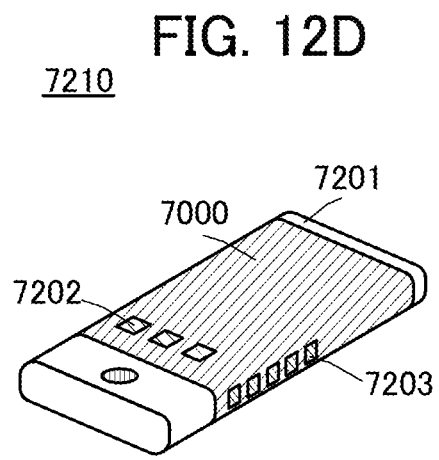

FIGS. 12C and 12D each illustrate an example of a portable information terminal. A portable information terminal 7200 illustrated in FIG. 12C and a portable information terminal 7210 illustrated in FIG. 12D each include a housing 7201 and the display portion 7000. The portable information terminal 7200 may also include an operation button, an external connection port, a speaker, a microphone, an antenna, a camera, a battery, or the like. The display portion 7000 is provided with a touch sensor. The portable information terminal can be operated by touching the display portion 7000 with a finger, a stylus, or the like.

Each of the portable information terminals described in this embodiment has one or more of a telephone function, a notebook function, and an information browsing function, for example. Specifically, each of the portable information terminals can be used as a smartphone. Each of the portable information terminals described in this embodiment can execute a variety of applications, such as mobile phone calls, e-mailing, reading and editing texts, music reproduction, Internet communication, and a computer game, for example.

The portable information terminal 7200 and the portable information terminal 7210 can display texts, image information, and the like on their plurality of surfaces. For example, as illustrated in FIGS. 12C and 12D, three operation buttons 7202 can be displayed on one surface, and information 7203 indicated by a rectangle can be displayed on another surface. FIG. 12C illustrates an example in which information is displayed on the top surface of the portable information terminal. FIG. 12D illustrates an example in which information is displayed on a side surface of the portable information terminal. Information may also be displayed on three or more surfaces of the portable information terminal.

Examples of the information include notification from a social networking service (SNS), display indicating reception of an e-mail or an incoming call, the title or the sender of an e-mail or the like, the date, the time, the remaining battery, and the reception strength of an antenna. Alternatively, an operation button, an icon, or the like may be displayed in place of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 12E:
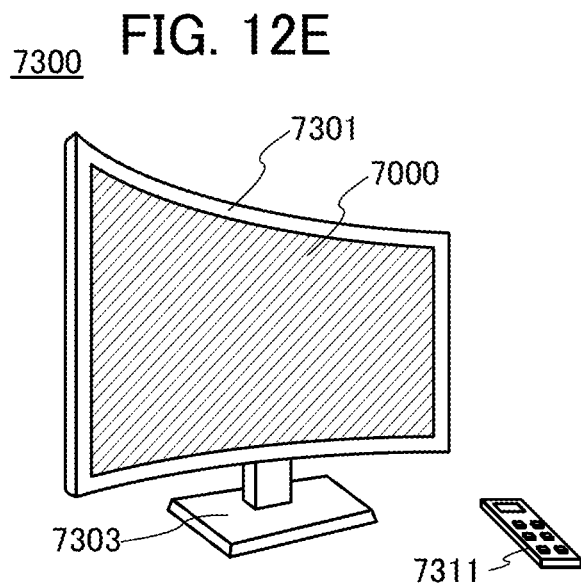

FIG. 12E illustrates an example of a television set. In a television set 7300, the display portion 7000 is incorporated in a housing 7301. Here, the housing 7301 is supported by a stand 7303.

The television set 7300 illustrated in FIG. 12E can be operated with an operation switch of the housing 7301 or a separate remote controller 7311. Furthermore, the display portion 7000 may be provided with a touch sensor so that the television set 7300 can be operated by touching the display portion 7000 with a finger or the like. The remote controller 7311 may include a display portion for displaying information output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. With the use of the receiver, general television broadcasting can be received. When the television set is connected to a communication network with or without wires via the modem, one-way (from a transmitter to a receiver) or two-way (between a transmitter and a receiver or between receivers) data communication can be performed.

FIGS. 13A to 13I illustrate examples of portable information terminals each including a flexible and bendable display portion 7001.

The display portion 7001 includes the display device or the like of one embodiment of the present invention. The display portion 7001 may be provided with a touch sensor so that the portable information terminal can be operated by touching the display portion 7001 with a finger or the like. According to one embodiment of the present invention, an electronic device including a display portion with an extremely high resolution can be provided.

Figure 13A:
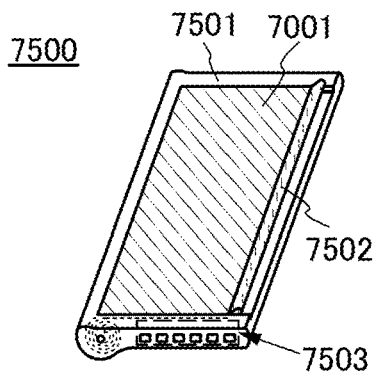
FIGS. 13A to 13I each illustrate an electronic device of an embodiment.
Figure 13B:
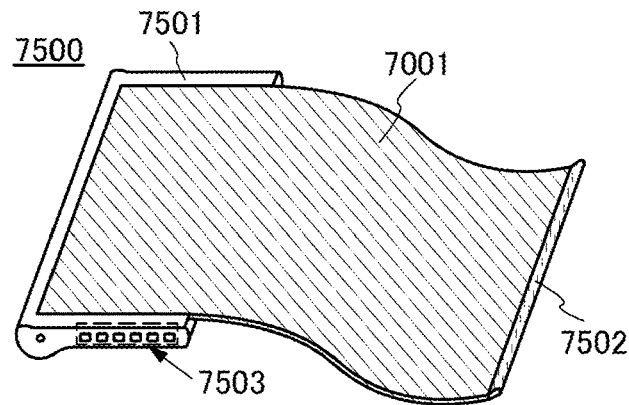

FIGS. 13A and 13B are perspective views illustrating an example of a portable information terminal. A portable information terminal 7500 includes a housing 7501, the display portion 7001, a display portion pull 7502, operation buttons 7503, and the like.

The portable information terminal 7500 includes the flexible display portion 7001 that is rolled in the housing 7501. The display portion 7001 can be pulled out with the display portion pull 7502.

The portable information terminal 7500 can receive an image signal with a control portion incorporated therein and can display the received image on the display portion 7001. Furthermore, the portable information terminal 7500 incorporates a battery. The housing 7501 may include a terminal portion for connecting a connector so that an image signal and power can be directly supplied from the outside through a wire.

With the operation buttons 7503, for example, power can be turned on or off and displayed images can be switched. Although FIGS. 13A and 13B illustrate an example in which the operation buttons 7503 are positioned on a side surface of the portable information terminal 7500, one embodiment of the present invention is not limited thereto. The operation buttons 7503 may be positioned on a display surface (a front surface) or a rear surface of the portable information terminal 7500.

FIG. 13B illustrates the portable information terminal 7500 in the state in which the display portion 7001 is pulled out. Images can be displayed on the display portion 7001 in this state. In addition, the portable information terminal 7500 in the state in FIG. 13A, in which part of the display portion 7001 is rolled, may perform display in a manner different from that in the state in FIG. 13B, in which the display portion 7001 is pulled out. For example, in the state in FIG. 13A, the rolled portion of the display portion 7001 is in a non-display state, leading to a reduction in power consumption of the portable information terminal 7500.

Note that a reinforcement frame may be provided for a side portion of the display portion 7001 so that the display portion 7001 maintains a flat display surface when pulled out.

In addition to this structure, a speaker may be provided in the housing so that sound can be output in accordance with an audio signal received together with an image signal.

Figure 13C:
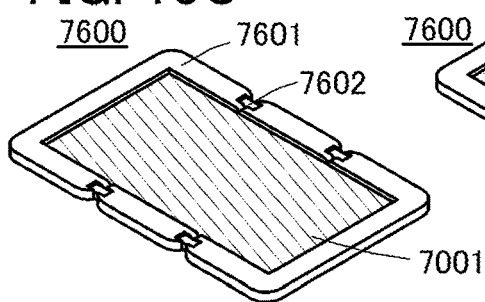
Figure 13D:
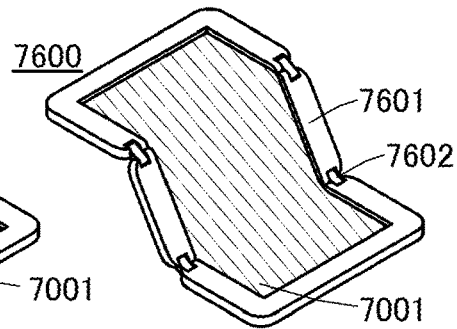
Figure 13E:
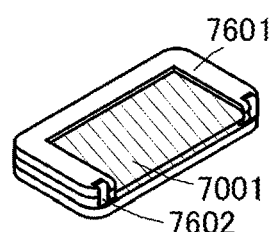

FIGS. 13C to 13E illustrate an example of a foldable portable information terminal. FIG. 13C illustrates a portable information terminal 7600 that is opened. FIG. 13D illustrates the portable information terminal 7600 that is being opened or being folded. FIG. 13E illustrates the portable information terminal 7600 that is folded. The portable information terminal 7600 is highly portable when folded, and is highly browsable when opened because of a seamless large display region.

The display portion 7001 is supported by three housings 7601 joined together by hinges 7602. By being folded at the hinges 7602 between the two housings 7601, the portable information terminal 7600 can be reversibly changed in shape from the opened state to the folded state.

Figure 13F:
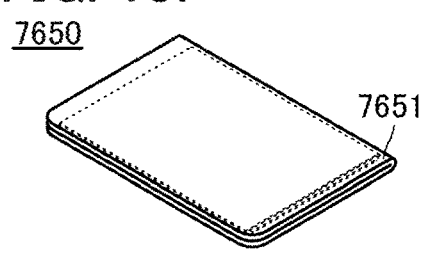
Figure 13G:
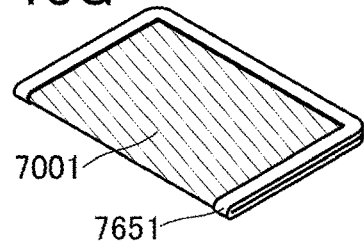

FIGS. 13F and 13G illustrate an example of a foldable portable information terminal. FIG. 13F illustrates a portable information terminal 7650 that is folded so that the display portion 7001 is on the inside. FIG. 13G illustrates the portable information terminal 7650 that is folded so that the display portion 7001 is on the outside. The portable information terminal 7650 includes the display portion 7001 and a non-display portion 7651. When not used, the portable information terminal 7650 is folded so that the display portion 7001 is on the inside, whereby the display portion 7001 can be prevented from being contaminated and damaged.

Figure 13H:
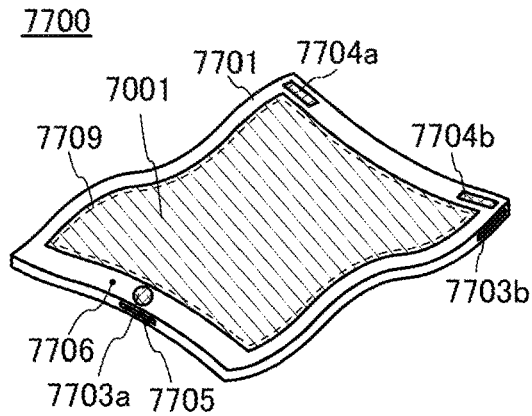

FIG. 13H illustrates an example of a flexible portable information terminal. A portable information terminal 7700 includes a housing 7701 and the display portion 7001. The portable information terminal 7700 may also include buttons 7703a and 7703b which serve as input means, speakers 7704a and 7704b which serve as sound output means, an external connection port 7705, a microphone 7706, and the like. A flexible battery 7709 can be mounted on the portable information terminal 7700. The battery 7709 may overlap with the display portion 7001, for example.

The housing 7701, the display portion 7001, and the battery 7709 have flexibility. Thus, it is easy to bend the portable information terminal 7700 into a desired shape and to twist the portable information terminal 7700. For example, the portable information terminal 7700 can be bent so that the display portion 7001 is on the inside or on the outside. The portable information terminal 7700 can also be used in the rolled state. Since the housing 7701 and the display portion 7001 can be freely transformed in this manner, the portable information terminal 7700 has an advantage of being less likely to be broken even when the portable information terminal 7700 is dropped down or accidentally subjected to external forces.

The portable information terminal 7700 is lightweight and therefore can be used conveniently in various situations. For example, the portable information terminal 7700 can be suspended by a clip or the like for holding an upper portion of the housing 7701 or hung on a wall with a magnet or the like for fixing the housing 7701.

Figure 13I:
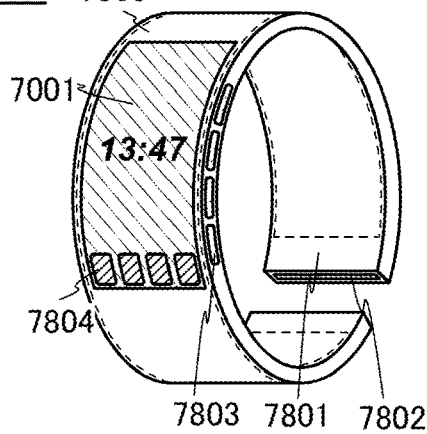

FIG. 13I illustrates an example of a wrist-watch-type portable information terminal. A portable information terminal 7800 includes a band 7801, the display portion 7001, an input/output terminal 7802, operation buttons 7803, and the like. The band 7801 functions as a housing. In addition, a flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily bent into a desired shape.

The operation buttons 7803 can have a variety of functions such as time setting, ON/OFF of the power, ON/OFF of wireless communication, setting and cancellation of a silent mode, and setting and cancellation of a power saving mode. For example, the functions of the operation buttons 7803 can be freely set by an operating system incorporated in the portable information terminal 7800.

By touching an icon 7804 displayed on the display portion 7001 with a finger or the like, an application can be started.

The portable information terminal 7800 can employ near field communication conformable to a communication standard. For example, through mutual communication with a headset capable of wireless communication, hands-free calling is possible.

The portable information terminal 7800 may include the input/output terminal 7802. In the case where the input/output terminal 7802 is provided, data can be directly communicated with another information terminal via a connector. Charging through the input/output terminal 7802 is also possible. Note that charging of the portable information terminal described in this embodiment can also be performed by contactless power transmission without using the input/output terminal.

Figure 14A:
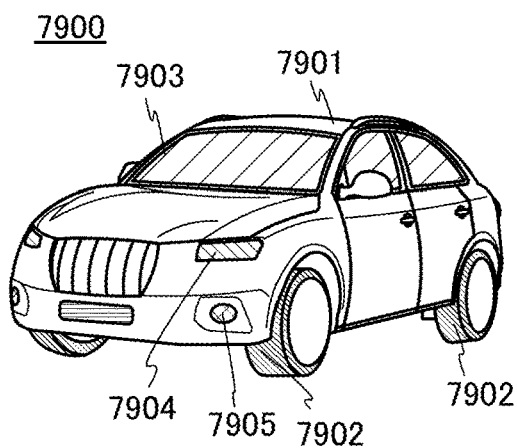
FIGS. 14A to 14F each illustrate an electronic device of an embodiment.
Figure 14B:
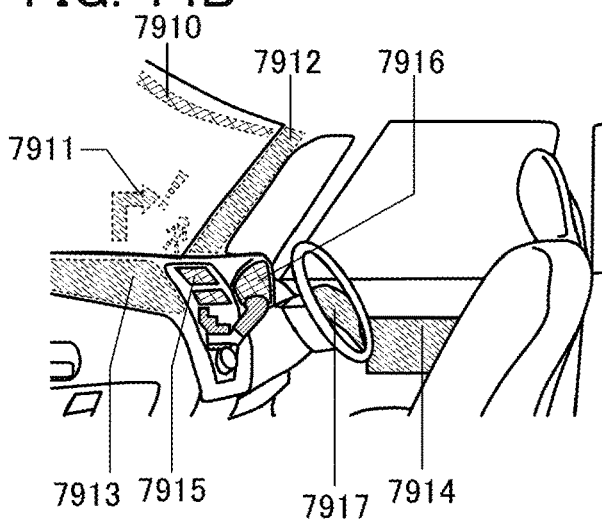

FIG. 14A is an external view of an automobile 7900. FIG. 14B illustrates a driver's seat of the automobile 7900. The automobile 7900 includes a car body 7901, wheels 7902, a windshield 7903, lights 7904, fog lamps 7905, and the like.

The display device of one embodiment of the present invention can be used for a display portion or the like of the automobile 7900. For example, the display device of one embodiment of the present invention can be provided in display portions 7910 to 7917 illustrated in FIG. 14B.

The display portion 7910 and the display portion 7911 are provided in part of the windshield of the automobile. Therefore, the driver's vision is not hindered during the driving of the automobile 7900. Thus, the display device of one embodiment of the present invention can be provided in part of the windshield of the automobile 7900.

The display portion 7912 is provided in a pillar portion. The display portion 7913 is provided in a dashboard portion. For example, the display portion 7912 can compensate for the view hindered by the pillar by showing an image taken by an imaging unit provided on the car body. Similarly, the display portion 7913 can compensate for the view hindered by the dashboard, and the display portion 7914 can compensate for the view hindered by the door. That is, by displaying images taken by the imaging unit provided on the outside of the automobile, blind areas can be eliminated and safety can be increased. When images are displayed to compensate for the blind areas, the driver can confirm safety easily and comfortably.

The display portion 7917 is provided on a steering wheel. The display portion 7915, the display portion 7916, or the display portion 7917 can display a variety of information such as navigation information, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 7910 to 7914.

A display portion including the display device of one embodiment of the present invention may have a flat surface. In this case, the display device of one embodiment of the present invention does not necessarily have a curved surface and flexibility.

Figure 14C:
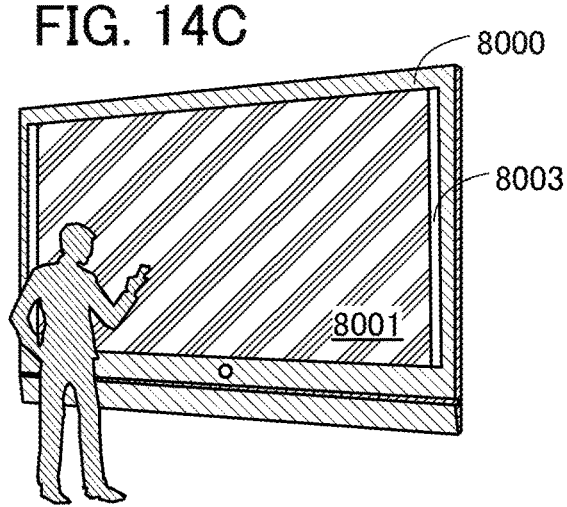
Figure 14D:
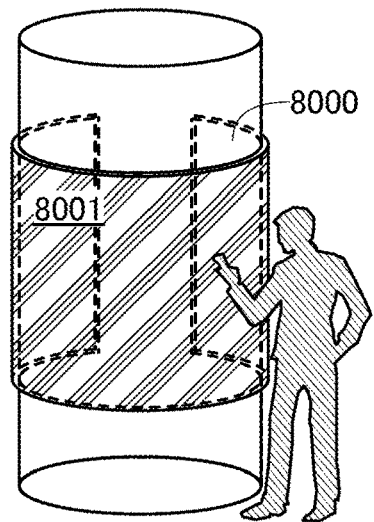

FIGS. 14C and 14D illustrate examples of digital signage. The digital signage include a housing 8000, a display portion 8001, a speaker 8003, and the like. The digital signage can also include an LED lamp, an operation key (including a power switch or an operation switch), a connection terminal, a variety of sensors, a microphone, or the like.

The digital signage in FIG. 14D is mounted on a cylindrical pillar.

The display portion 8001 with a larger area can provide more information at a time. In addition, the display portion 8001 with a larger area can attract more attention, so that the effect of an advertisement can be increased, for example.

It is preferable to use a touch panel for the display portion 8001 because a user can intuitively operate the display portion 8001, not just seeing a still or moving image displayed thereon. Moreover, for the purpose of providing information such as route information or traffic information, such intuitive operation can enhance usability.

Figure 14E:
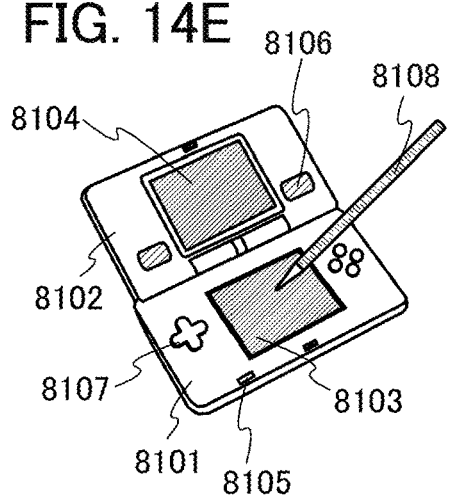

FIG. 14E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 14E includes two display portions 8103 and 8104. Note that the number of display portions of an electronic device of one embodiment of the present invention is not limited to two and may be one or three or more as long as at least one display portion includes the display device of one embodiment of the present invention.

Figure 14F:
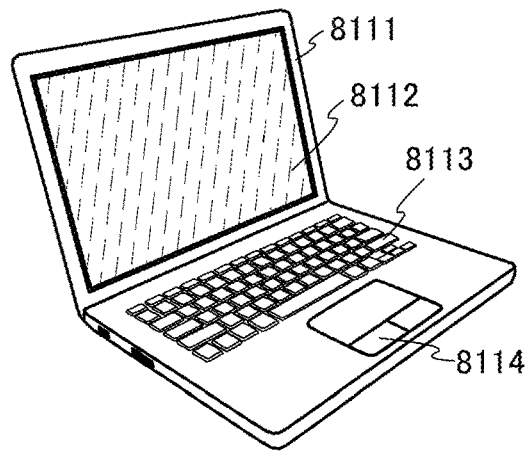

FIG. 14F illustrates a laptop personal computer including a housing 8111, a display portion 8112, a keyboard 8113, a pointing device 8114, and the like.

The display device of one embodiment of the present invention can be used for the display portion 8112.

Figure 15A:
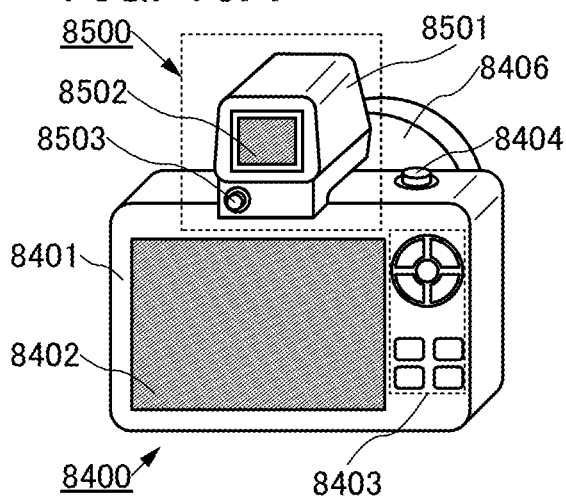
FIGS. 15A to 15E each illustrate an electronic device of an embodiment.

FIG. 15A is an external view of a camera 8400 to which a finder 8500 is attached.

The camera 8400 includes a housing 8401, a display portion 8402, operation buttons 8403, a shutter button 8404, and the like. Furthermore, a detachable lens 8406 is attached to the camera 8400.

Although the lens 8406 of the camera 8400 here is detachable from the housing 8401 for replacement, the lens 8406 may be built into the housing.

When the shutter button 8404 is pressed, the camera 8400 can take an image. In addition, the display portion 8402 functions as a touch panel, and an image can be taken when the display portion 8402 is touched.

The housing 8401 of the camera 8400 has a mount including an electrode, to which the finder 8500, a stroboscope, and the like can be connected.

The finder 8500 includes a housing 8501, a display portion 8502, a button 8503, and the like.

The housing 8501 includes a mount for engagement with the mount of the camera 8400 so that the finder 8500 can be attached to the camera 8400. The mount includes an electrode, and an image or the like received from the camera 8400 through the electrode can be displayed on the display portion 8502.

The button 8503 functions as a power button. The display portion 8502 can be turned on and off with the button 8503.

The display device of one embodiment of the present invention can be used for the display portion 8402 of the camera 8400 and the display portion 8502 of the finder 8500.

Although the camera 8400 and the finder 8500 are separate electronic devices and are detachable from each other in FIG. 15A, the housing 8401 of the camera 8400 may include a finder having the display device of one embodiment of the present invention.

Figure 15B:
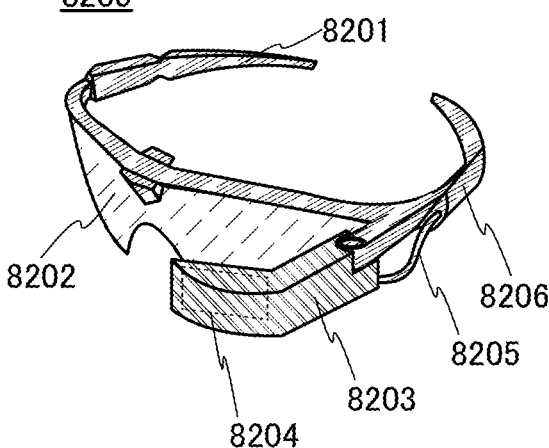

FIG. 15B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeballs or the eyelids of a user is captured by a camera in the main body 8203, and then, the coordinates of the point the user looks at are calculated using the captured information to utilize the user's eyes as an input means.

The mounting portion 8201 may include a plurality of electrodes so as to be in contact with the user. The main body 8203 may have a function of sensing a current which flows through the electrodes in accordance with the movement of the user's eyeballs to determine the point the user looks at. The main body 8203 may also have a function of sensing a current flowing through the electrodes to monitor the user's pulse. The mounting portion 8201 may include sensors such as a temperature sensor, a pressure sensor, and an acceleration sensor so that the user's biological information can be displayed on the display portion 8204. The movement of the user's head or the like may be sensed so that an image displayed on the display portion 8204 can be changed in synchronization with the movement.

The display device of one embodiment of the present invention can be used for the display portion 8204.

Figure 15C:
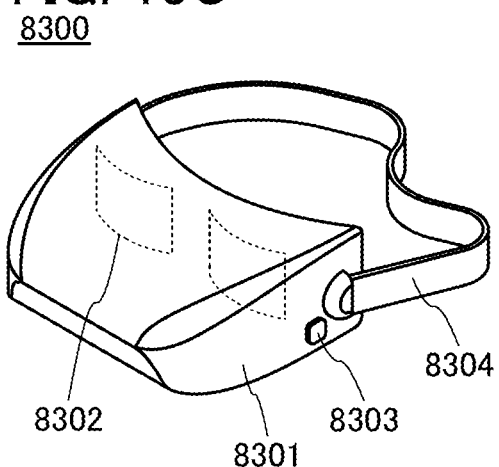
Figure 15D:
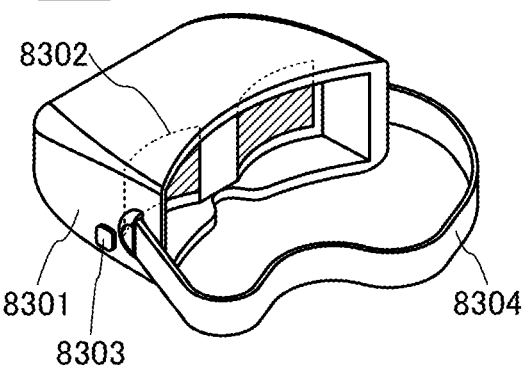

FIGS. 15C and 15D are external views of a head-mounted display 8300.

The head-mounted display 8300 includes a housing 8301, two display portions 8302, an operation button 8303, and a band-like fixing member 8304.

The head-mounted display 8300 has the functions of the above-described head-mounted display 8200 and includes two display portions.

Since the head-mounted display 8300 includes the two display portions 8302, the user's eyes can see their respective display portions. Thus, for example, even a high-resolution three-dimensional image using parallax can be displayed. In addition, the display portion 8302 is curved around an arc with an approximate center at the user's eye. This allows a uniform distance between the user's eye and the display surface of the display portion; thus, the user can see a more natural image. Furthermore, the user's eye is positioned in the normal direction of the display surface of the display portion; therefore, even when the luminance or chromaticity of light from the display portion is changed depending on the viewing angle, the influence of the change can be substantially ignorable and thus a more realistic image can be displayed.

The operation button 8303 functions as a power button or the like. Besides the operation button 8303, a button may be provided.

Figure 15E:
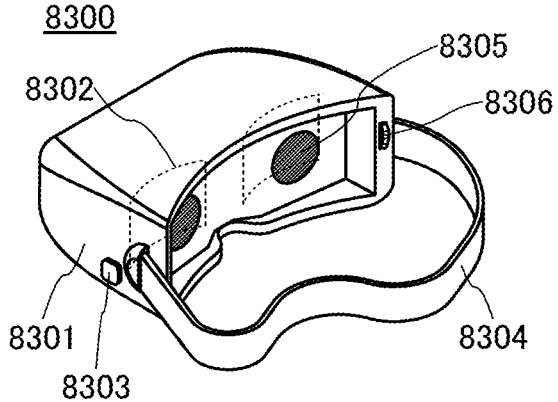

As illustrated in FIG. 15E, lenses 8305 may be provided between the display portions 8302 and the user's eyes. The user can see magnified images on the display portions 8302 through the lenses 8305, leading to a higher sense of presence. In this case, as illustrated in FIG. 15E, a dial 8306 for changing the position of the lenses and adjusting visibility may be provided.

The display device of one embodiment of the present invention can be used for the display portion 8302. The display device of one embodiment of the present invention can have an extremely high resolution; thus, even when images are magnified using the lenses 8305 as illustrated in FIG. 15E, the user does not perceive pixels, and thus, more realistic images can be displayed.

Figure 16A:
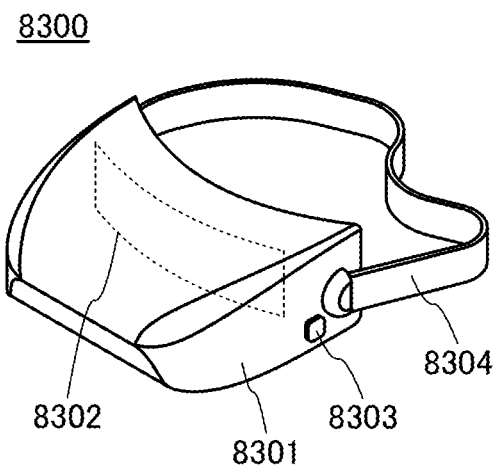
FIGS. 16A to 16D each illustrate an electronic device of an embodiment.
Figure 16B:
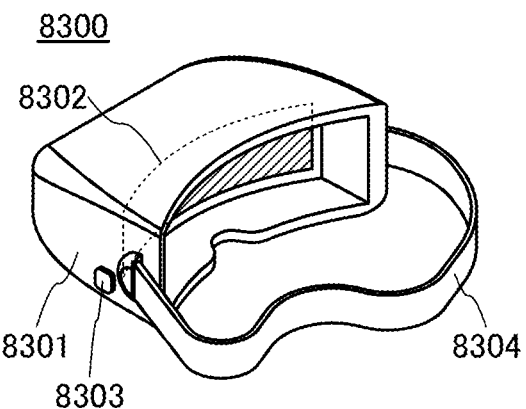
Figure 16C:
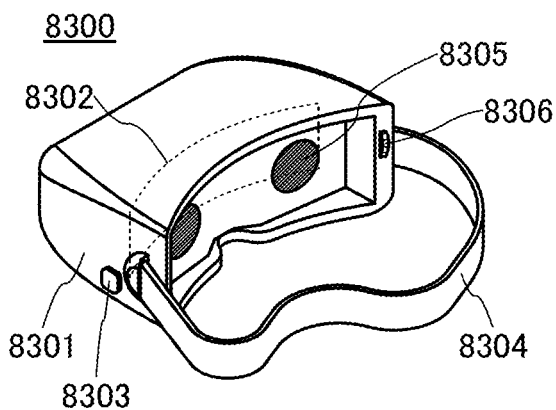

FIGS. 16A to 16C illustrate examples in which the head-mounted display includes one display portion 8302. Such a structure can reduce the number of components.

The display portion 8302 can display an image for the right eye and an image for the left eye side by side on a right region and a left region, respectively. Thus, a three-dimensional image using binocular disparity can be displayed.

One image which can be seen with both eyes may be displayed on the entire display portion 8302. Thus, a panorama image can be displayed from end to end of the field of view, which can provide a higher sense of reality.

As illustrated in FIG. 16C, the lenses 8305 may be provided. Two images may be displayed side by side on the display portion 8302. Alternatively, one image may be displayed on the display portion 8302 and seen with both eyes through the lenses 8305.

Figure 16D:
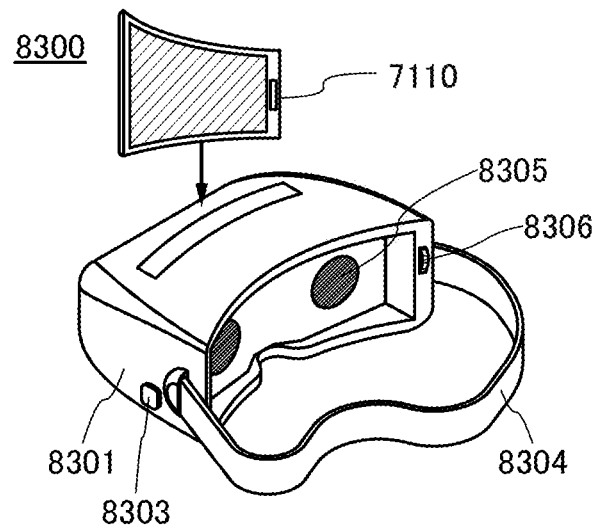

As illustrated in FIG. 16D, another electronic device such as the mobile phone 7110 illustrated in FIG. 12B may be inserted in the housing 8301, whereby the user can see an image displayed on the mobile phone 7110.

At least part of this embodiment can be implemented in combination with any of the other embodiments described in this specification as appropriate.

This application is based on Japanese Patent Application Serial No. 2016-152394 filed with Japan Patent Office on Aug. 3, 2016, the entire contents of which are hereby incorporated by reference.

What is claimed is:

1. A display device comprising a display portion comprising a plurality of pixels, each of the plurality of pixels comprising:
   a light-emitting element;
   a first transistor;
   a second transistor;
   a third transistor; and
   a capacitor,
   wherein one of a source and a drain of the first transistor is connected to a gate of the second transistor,
   wherein a gate of the first transistor is connected to a gate of the third transistor,
   wherein one of a source and a drain of the third transistor is connected to the light-emitting element,
   wherein the other of the source and the drain of the third transistor is connected to a wiring,
   wherein a first terminal of the capacitor is connected to the one of the source and the drain of the first transistor,
   wherein a second terminal of the capacitor is connected to the one of the source and the drain of the third transistor,
   wherein the first transistor comprises an oxide semiconductor layer in a channel formation region,
   wherein the second transistor comprises silicon in a channel formation region,
   wherein an insulating layer is provided over the gate of the second transistor, and
   wherein the oxide semiconductor layer is provided over the insulating layer.

2. The display device according to claim 1,
   wherein the oxide semiconductor layer comprises indium, gallium, and zinc.

3. The display device according to claim 1, further comprising a gate line driver circuit,
   wherein the gate line driver circuit comprises a circuit formed of a plurality of transistors having the same conductivity type, and
   wherein each of the plurality of transistors comprises silicon in a channel formation region.

4. The display device according to claim 1,
   wherein the insulating layer comprises silicon nitride.

5. The display device according to claim 1,
   wherein the gate of the first transistor is provided over the oxide semiconductor layer, and wherein the gate of the first transistor comprises molybdenum and titanium.

6. The display device according to claim 1,
wherein a thickness of the oxide semiconductor layer is greater than or equal to 3 nm and less than or equal to 50 nm.

7. The display device according to claim 1,
wherein one of a source and a drain of the second transistor is electrically connected to the light-emitting element.

8. A display device comprising a display portion comprising a plurality of pixels, each of the plurality of pixels comprising:
a light-emitting element;
a first transistor;
a second transistor;
a third transistor; and
a capacitor,
wherein one of a source and a drain of the first transistor is connected to a gate of the second transistor,
wherein a gate of the first transistor is connected to a gate of the third transistor,
wherein one of a source and a drain of the third transistor is connected to the light-emitting element,
wherein the other of the source and the drain of the third transistor is connected to a wiring,
wherein a first terminal of the capacitor is connected to the one of the source and the drain of the first transistor,
wherein a second terminal of the capacitor is connected to the one of the source and the drain of the third transistor,
wherein the first transistor comprises an oxide semiconductor layer in a channel formation region,
wherein the second transistor comprises silicon in a channel formation region,
wherein a first insulating layer comprising silicon oxide is provided over and in contact with the gate of the second transistor,
wherein a second insulating layer comprising silicon nitride is provided over the first insulating layer,
wherein a third insulating layer comprising silicon oxide is provided over the second insulating layer, and
wherein the oxide semiconductor layer is provided over and in contact with the third insulating layer.

9. The display device according to claim 8,
wherein the oxide semiconductor layer comprises indium, gallium, and zinc.

10. The display device according to claim 8, further comprising a gate line driver circuit,
wherein the gate line driver circuit comprises a circuit formed of a plurality of transistors having the same conductivity type, and
wherein each of the plurality of transistors comprises silicon in a channel formation region.

11. The display device according to claim 8,
wherein the gate of the first transistor is provided over the oxide semiconductor layer, and
wherein the gate of the first transistor comprises molybdenum and titanium.

12. The display device according to claim 8,
wherein a thickness of the oxide semiconductor layer is greater than or equal to 3 nm and less than or equal to 50 nm.

13. The display device according to claim 8,
wherein one of a source and a drain of the second transistor is electrically connected to the light-emitting element.

14. A display device comprising a display portion comprising a plurality of pixels, each of the plurality of pixels comprising:
a light-emitting element;
a first transistor;
a second transistor;
a third transistor; and
a capacitor,
wherein one of a source and a drain of the first transistor is connected to a gate of the second transistor,
wherein a gate of the first transistor is connected to a gate of the third transistor,
wherein one of a source and a drain of the third transistor is connected to the light-emitting element,
wherein the other of the source and the drain of the third transistor is connected to a wiring,
wherein a first terminal of the capacitor is connected to the one of the source and the drain of the first transistor,
wherein a second terminal of the capacitor is connected to the one of the source and the drain of the third transistor,
wherein the first transistor comprises an oxide semiconductor layer in a channel formation region,
wherein the second transistor comprises silicon in a channel formation region,
wherein the second transistor comprises gate electrodes provided under and over the channel formation region of the second transistor,
wherein an insulating layer is provided over the second transistor, and
wherein the oxide semiconductor layer is provided over the insulating layer.

15. The display device according to claim 14,
wherein the oxide semiconductor layer comprises indium, gallium, and zinc.

16. The display device according to claim 14, further comprising a gate line driver circuit,
wherein the gate line driver circuit comprises a circuit formed of a plurality of transistors having the same conductivity type, and
wherein each of the plurality of transistors comprises silicon in a channel formation region.

17. The display device according to claim 14,
wherein the insulating layer comprises silicon nitride.

18. The display device according to claim 14,
wherein the gate of the first transistor is provided over the oxide semiconductor layer, and
wherein the gate of the first transistor comprises molybdenum and titanium.

19. The display device according to claim 14,
wherein a thickness of the oxide semiconductor layer is greater than or equal to 3 nm and less than or equal to 50 nm.

20. The display device according to claim 14,
wherein one of a source and a drain of the second transistor is electrically connected to the light-emitting element.

21. A display device comprising a display portion comprising a plurality of pixels, each of the plurality of pixels comprising:
a light-emitting element;
a first transistor;
a second transistor;
a third transistor; and
a capacitor,
wherein one of a source and a drain of the first transistor is connected to a gate of the second transistor, wherein a gate of the first transistor is connected to a gate of the third transistor, wherein one of a source and a drain of the third transistor is connected to the light-emitting element, wherein the other of the source and the drain of the third transistor is connected to a wiring, wherein a first terminal of the capacitor is connected to the one of the source and the drain of the first transistor, wherein a second terminal of the capacitor is connected to the one of the source and the drain of the third transistor, wherein the first transistor comprises an oxide semiconductor layer in a channel formation region, wherein the second transistor comprises a semiconductor layer comprising silicon in a channel formation region, wherein a first insulating layer is provided over the gate of the second transistor, wherein the oxide semiconductor layer is provided over the first insulating layer, wherein the light-emitting element comprises a first conductive layer, a layer comprising an organic material over the first conductive layer, and a second conductive layer over the layer comprising the organic material, wherein a second insulating layer is provided over the first conductive layer, wherein the layer comprising the organic material is provided over the second insulating layer, and wherein the layer comprising the organic material overlaps with the oxide semiconductor layer and the semiconductor layer comprising silicon.

22. The display device according to claim 21,
wherein the oxide semiconductor layer comprises indium, gallium, and zinc.

23. The display device according to claim 21, further comprising a gate line driver circuit,
wherein the gate line driver circuit comprises a circuit formed of a plurality of transistors having the same conductivity type, and
wherein each of the plurality of transistors comprises silicon in a channel formation region.

24. The display device according to claim 21,
wherein the first insulating layer comprises silicon nitride.

25. The display device according to claim 21,
wherein the gate of the first transistor is provided over the oxide semiconductor layer, and
wherein the gate of the first transistor comprises molybdenum and titanium.

26. The display device according to claim 21,
wherein a thickness of the oxide semiconductor layer is greater than or equal to 3 nm and less than or equal to 50 nm.

27. The display device according to claim 21,
wherein one of a source and a drain of the second transistor is electrically connected to the light-emitting element.

28. A display device comprising a display portion comprising a plurality of pixels, each of the plurality of pixels comprising:
a light-emitting element;
a first transistor;
a second transistor;
a third transistor; and
a capacitor,
wherein one of a source and a drain of the first transistor is connected to a gate of the second transistor,
wherein a gate of the first transistor is connected to a gate of the third transistor,
wherein one of a source and a drain of the third transistor is connected to the light-emitting element,
wherein the other of the source and the drain of the third transistor is connected to a wiring,
wherein a first terminal of the capacitor is connected to the one of the source and the drain of the first transistor,
wherein a second terminal of the capacitor is connected to the one of the source and the drain of the third transistor,
wherein the first transistor comprises an oxide semiconductor layer in a channel formation region,
wherein the second transistor comprises single-crystal silicon in a channel formation region,
wherein an insulating layer is provided over the gate of the second transistor, and
wherein the oxide semiconductor layer is provided over the insulating layer.

29. The display device according to claim 28,
wherein the oxide semiconductor layer comprises indium, gallium, and zinc.

30. The display device according to claim 28, further comprising a gate line driver circuit,
wherein the gate line driver circuit comprises a circuit formed of a plurality of transistors having the same conductivity type, and
wherein each of the plurality of transistors comprises silicon in a channel formation region.

31. The display device according to claim 28,
wherein the insulating layer comprises silicon nitride.

32. The display device according to claim 28,
wherein the gate of the first transistor is provided over the oxide semiconductor layer, and
wherein the gate of the first transistor comprises molybdenum and titanium.

33. The display device according to claim 28,
wherein a thickness of the oxide semiconductor layer is greater than or equal to 3 nm and less than or equal to 50 nm.

34. The display device according to claim 28,
wherein one of a source and a drain of the second transistor is electrically connected to the light-emitting element.

* * * * *